US009318300B2

(12) United States Patent
Hiroki et al.

(10) Patent No.: US 9,318,300 B2
(45) Date of Patent: Apr. 19, 2016

(54) CHARGED PARTICLE BEAM INSTRUMENT

(71) Applicant: JEOL Ltd., Tokyo (JP)

(72) Inventors: Yasushi Hiroki, Tokyo (JP); Mitsuaki Ohsaki, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/526,582

(22) Filed: Oct. 29, 2014

(65) Prior Publication Data

US 2015/0137001 A1    May 21, 2015

(30) Foreign Application Priority Data

Oct. 30, 2013   (JP) ................. 2013-225916

(51) Int. Cl.
| | |
|---|---|
| *H01J 37/26* | (2006.01) |
| *H01J 37/18* | (2006.01) |
| *H01J 37/20* | (2006.01) |
| *H01J 41/02* | (2006.01) |

(52) U.S. Cl.
CPC ............. *H01J 37/18* (2013.01); *H01J 37/20* (2013.01); *H01J 41/02* (2013.01); *H01J 2237/182* (2013.01); *H01J 2237/2002* (2013.01); *H01J 2237/2605* (2013.01)

(58) Field of Classification Search
USPC .............. 250/305, 306, 307, 309, 310, 311, 250/492.1, 492.3
See application file for complete search history.

(56) References Cited

U.S. PATENT DOCUMENTS

| | | | | |
|---|---|---|---|---|
| 4,889,995 | A * | 12/1989 | Tsutsumi ................ | H01J 37/18 250/289 |
| 2005/0017634 | A1 * | 1/2005 | Kamio ..................... | H01J 9/241 313/553 |
| 2006/0176928 | A1 * | 8/2006 | Nakamura ............ | H01L 21/6719 373/60 |
| 2011/0233401 | A1 * | 9/2011 | Nishinaka et al. ........... | 250/310 |

FOREIGN PATENT DOCUMENTS

JP               201320747 A      1/2013

* cited by examiner

*Primary Examiner* — Nicole Ippolito
(74) *Attorney, Agent, or Firm* — The Webb Law Firm

(57) ABSTRACT

A charged particle beam instrument is offered which can easily perform an in situ observation in a gaseous atmosphere. The charged particle beam instrument (100) is used to perform an observation of a specimen (S) placed in a gaseous atmosphere and has a specimen chamber (2), a gas supply portion (6) for supplying a gas into the specimen chamber (2), a venting portion (7) for venting the specimen chamber (2), a gaseous environment adjuster (4), and a gas controller (812) for controlling the gaseous environment adjuster (4). This adjuster (4) has a gas inflow rate adjusting valve (40) for adjusting the flow rate of the gas supplied into the specimen chamber (2) and a first vacuum gauge (CG1) for measuring the pressure of the gas supplied into the specimen chamber (2). The gas controller (812) sets a target value of pressure for the gas supplied into the specimen chamber (2) based on a predetermined relational expression indicating a relationship between the reading of the first vacuum gauge (CG1) and the pressure inside the specimen chamber (2) and on a corrective coefficient for correcting the reading of the first vacuum gauge (CG1) according to the species of the gas supplied into the specimen chamber (2) and controls the gas inflow rate adjusting valve (40) such that the reading of the first vacuum gauge (CG1) reaches the target value of pressure.

10 Claims, 16 Drawing Sheets

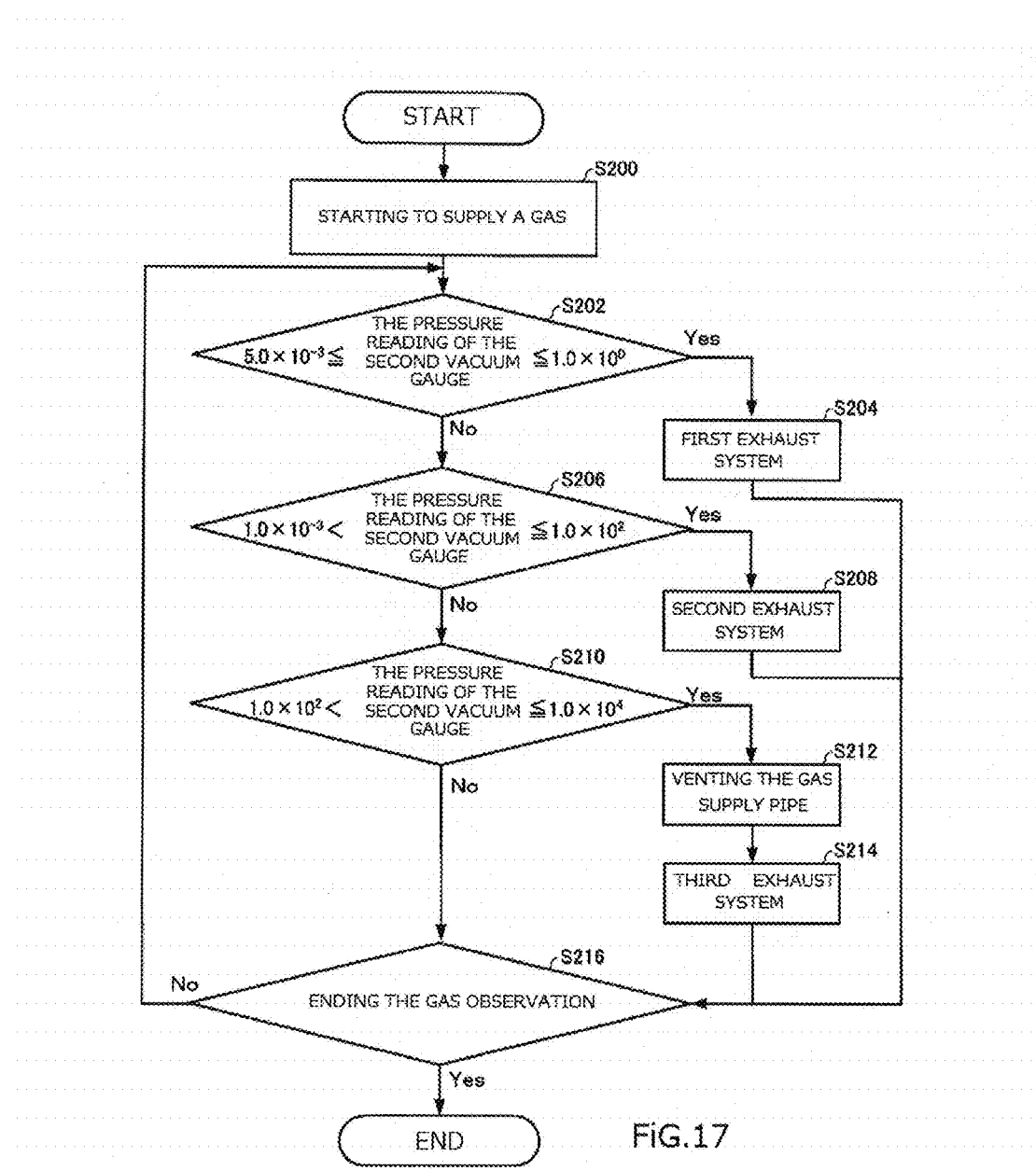

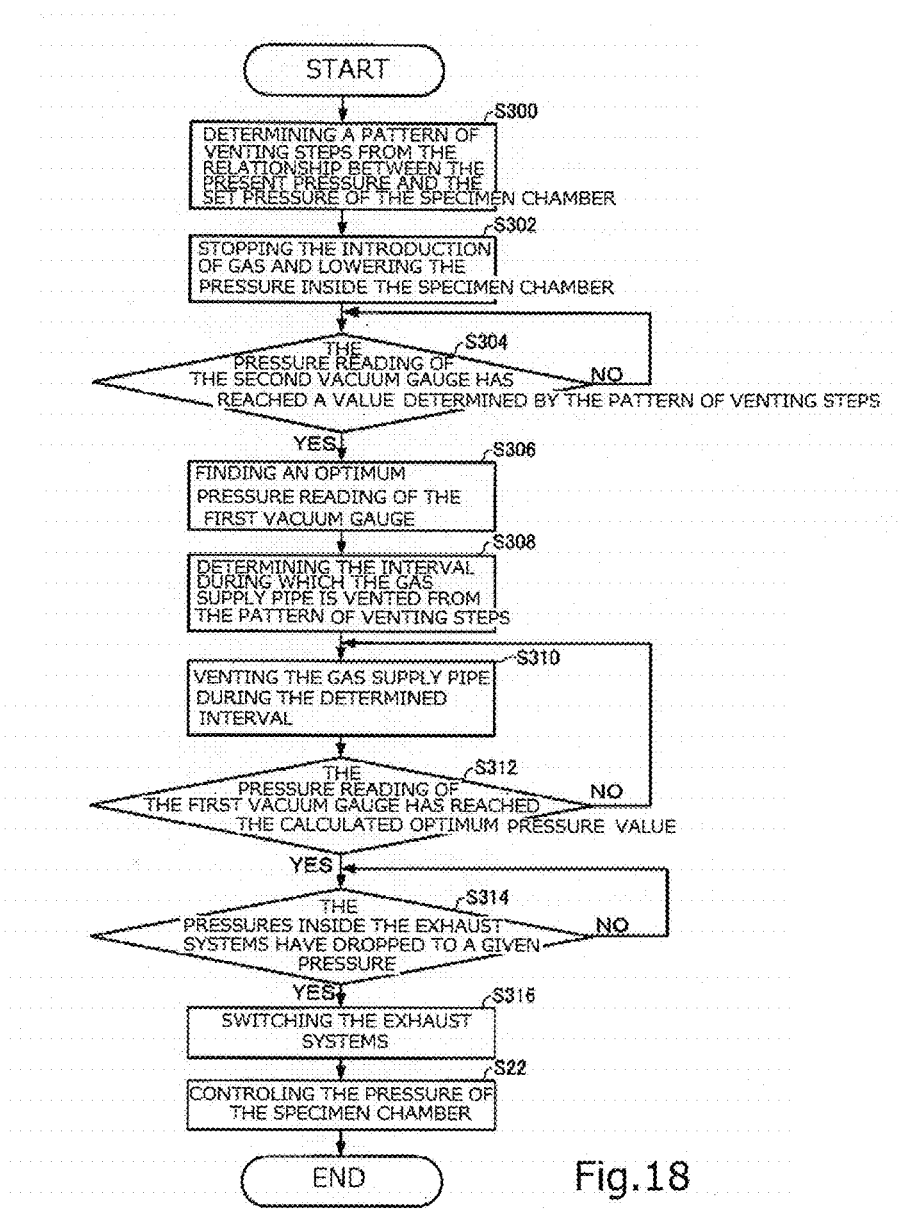

CHARGED PARTICLE BEAM INSTRUMENT

BACKGROUND OF THE INVENTION

1. Field of the Invention

The present invention relates to a charged particle beam instrument.

2. Description of Related Art

Known techniques for performing in situ observations in a gaseous atmosphere by a charged particle beam instrument such as an electron microscope use a diaphragm holder or a differential pumping system.

The former technique using the diaphragm holder makes use of a specimen holder having a space. A diaphragm through which an electron beam can be transmitted is used in this space. This space is filled with a gas. Under this condition, a specimen is observed.

On the other hand, in the latter technique using the differential pumping system, a gas, is directly introduced into a specimen chamber within an electron optical column. An in situ observation is performed while differentially pumping a space partitioned by plates to prevent leakage of gas to surroundings, the plates being provided with orifices to permit passage of an electron beam (see, for example, JP-A-2013-20747).

When an in situ observation is performed using the technique employing a differential pumping system, it is common practice to control a gaseous environment adjuster having gas inlet valves and a pumping system to control the flow of gas.

In the aforementioned technique using a diaphragm holder, it takes a great deal of time to fabricate a diaphragm permitting passage of an electron beam. Also, whenever the specimen is exchanged, a work for replacing or attaching minute parts such as a diaphragm and an O-ring is needed. Furthermore, there is the possibility that the fabricated diaphragm may break suddenly. This creates the danger that the electron microscope will be damaged.

Furthermore, in the technique using a differential pumping system, gas may leak into the specimen chamber via the orifices. Therefore, care has to be exercised in introducing high-pressure gas such that safety is achieved. Additionally, adjustments of the pressure of the introduced gas and venting operations are all performed manually. Therefore, it is impossible to perform these adjustments and operations by unskilled persons. Further, it may take long to make such adjustments.

SUMMARY OF THE INVENTION

In view of these problems, the present invention has been made. One object associated with some aspects of the present invention is to provide a charged particle beam instrument that can perform an in situ observation easily in a gaseous atmosphere.

(1) A charged particle beam instrument associated with the present invention permits an observation of a specimen in a gaseous atmosphere and has: a specimen chamber that accommodates the specimen; a gas supply portion for supplying a gas into the specimen chamber; a venting portion for venting the specimen chamber; a gaseous environment adjuster including a gas inflow rate adjusting valve for adjusting the flow rate of the gas supplied into the specimen chamber and a first vacuum gauge for measuring the pressure of the gas supplied into the specimen chamber; and a gas controller for controlling the gaseous environment adjuster. The gas controller sets a target value of pressure for the gas supplied into the specimen chamber, based on a relational expression indicating a relationship between the reading of the first vacuum gauge and the pressure inside the specimen chamber and on a corrective coefficient for correcting the reading of the first vacuum gauge according to the species of the gas supplied into the specimen chamber, and controls the gas inflow rate adjusting valve such that the reading of the first vacuum gauge reaches the target value of pressure.

In this charged particle beam instrument, the gas controller sets the target value of pressure for the gas supplied into the specimen chamber based on the relational expression indicating the relationship between the reading of the first vacuum gauge and the pressure inside the specimen chamber. Therefore, the pressure inside the specimen chamber can be controlled by controlling the gas inflow rate adjusting valve such that the reading of the first vacuum gauge reaches the target value of pressure. Furthermore, the gas controller corrects the target pressure using the corrective coefficient that corrects the reading of the first vacuum gauge according to the species of the gas. Consequently, the pressure inside the specimen chamber can be controlled for various gas species. In this charged particle beam instrument, therefore, the pressure of the gas inside the specimen chamber can be controlled easily. Hence, an in situ observation can be performed easily in a gaseous atmosphere.

(2) In one feature of this charged particle beam instrument, the venting portion has a plurality of exhaust systems which are different in pumping capabilities. The gaseous environment adjuster has a second vacuum gauge for measuring the pressure of the gas discharged from the specimen chamber. The gas controller may switch an operative exhaust system between the plurality of exhaust systems according to the reading of the second vacuum gauge.

In this charged particle beam instrument, the controllable range of pressures inside the specimen chamber can be extended.

(3) In another feature of this charged particle beam instrument, the plurality of exhaust systems may have their respective pumping devices which are different in pumping capabilities.

In this charged particle beam instrument, plural exhaust systems which are different in pumping capabilities can be accomplished.

(4) In a further feature of this charged particle beam instrument, the exhaust systems have their respective exhaust pipes which are different in diameter.

In this charged particle beam instrument, plural exhaust systems which are different in pumping capabilities can be accomplished.

(5) In a further feature of this charged particle beam instrument, this instrument may further include: a gas inlet nozzle permitting the gas supplied from the gas supply portion to be admitted into the specimen chamber; and a gas inlet nozzle driver for moving the gas inlet nozzle.

In this charged particle beam instrument, the gas inlet nozzle can be moved.

(6) In a yet other feature of this charged particle beam instrument, the gas inlet nozzle driver may move the gas inlet nozzle between a first position close to a specimen holding portion operative to hold the specimen and a second position more distant from the specimen holding portion than the first position.

In this charged particle beam instrument, when an in situ observation is performed, the gas inlet nozzle can be placed at the first position such that gas is effectively blown against the specimen. During gas purging, the gas inlet nozzle can be placed at the second position to permit the whole interior of the specimen chamber can be replaced by gas without directly blowing gas against the specimen.

(7) In a still other feature of this charged particle beam instrument, the gas inlet nozzle may have a heater for heating the nozzle.

In this charged particle beam instrument, the gas introduced into the specimen chamber can be heated. Furthermore, the gas inlet nozzle can be baked.

(8) In an additional feature of this charged particle beam instrument, the instrument may have a display device including a display controller that provides control such that operational information about the gaseous environment adjuster is displayed on the display device.

This charged particle beam instrument permits one to check how the gaseous environment adjuster is operating.

(9) In a yet further feature of this charged particle beam instrument, the display controller may provide control such that at least one type of information selected from the group consisting of information about the gas supplied into said specimen chamber, information about the type of gas in pipes through which the gas discharged from the specimen chamber passes, information about flow of the gases, and the information about the gas remaining in the pipes is displayed on the display device.

(10) In a yet additional feature of this charged particle beam instrument, the display controller may provide control to display information about timewise variation of the pressure reading of the first vacuum gauge on the display device.

This charged particle beam instrument permits one to check information indicating how the reading of the first vacuum gauge has varied temporally.

BRIEF DESCRIPTION OF THE DRAWINGS

FIG. 17 is a flowchart illustrating a subroutine illustrating the manner in which the gas controller of the charged particle beam instrument shown in FIG. 1 controls exhaust valves.

FIG. 18 is a flowchart illustrating a subroutine illustrating the manner in which the gas controller of the charged particle beam instrument shown in FIG. 1 lowers the pressure inside a specimen chamber.

DESCRIPTION OF THE INVENTION

The preferred embodiments of the present invention are hereinafter described in detail with reference to the drawings. It is to be understood that the embodiments provided below do not unduly restrict the scope of the present invention delineated by the appended claims and that not all the configurations described below are essential constituent components of the invention.

1. Charged Particle Beam Instrument

Figure 1:
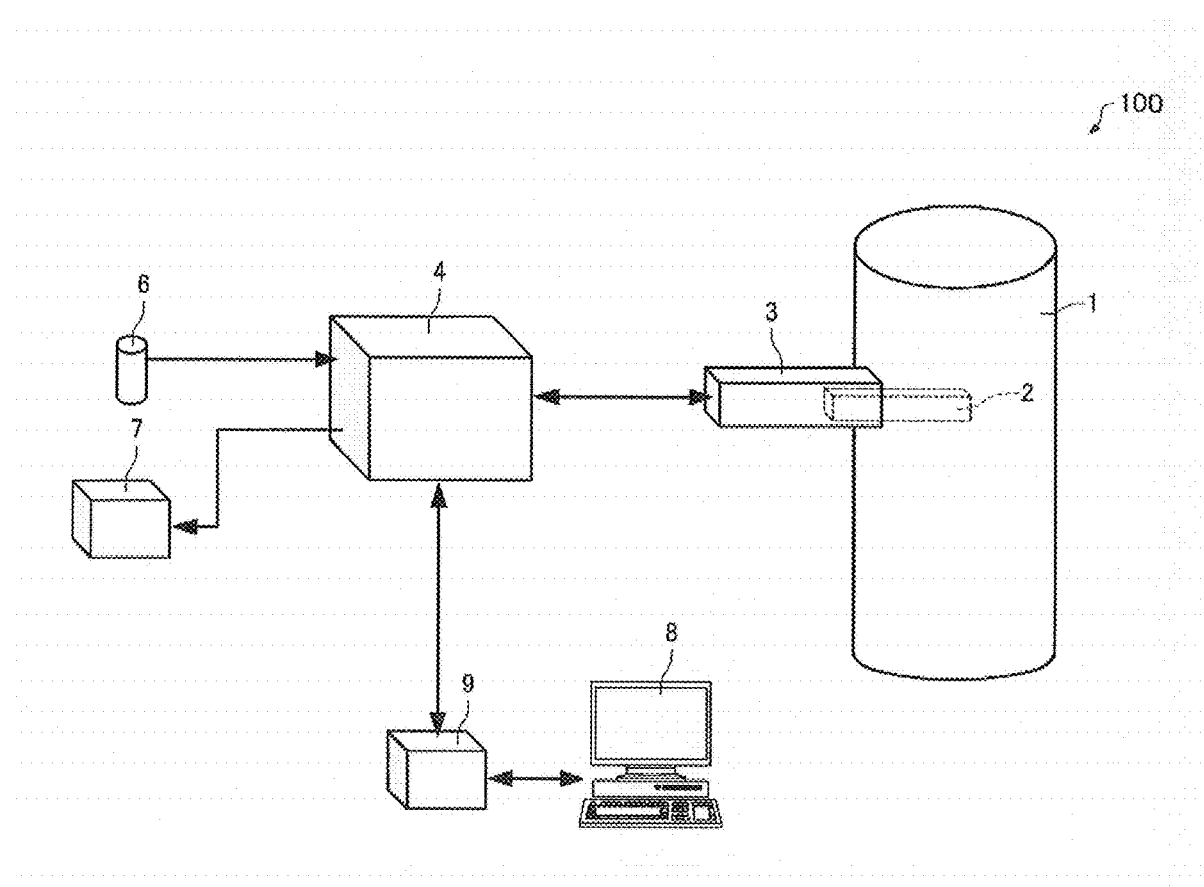
FIG. 1 is a block diagram of a charged particle beam instrument associated with one embodiment of the present invention.

The configuration of a charged particle beam instrument associated with one embodiment of the present invention is described by referring to FIG. 1, which shows the configuration of the charged particle beam instrument, generally indicated by reference numeral 100. It is herein assumed that the charged particle beam instrument 100 is a transmission electron microscope (TEM).

As shown in FIG. 1, the charged particle beam instrument 100 is configured including a body 1 constituting an electron optical column, a gas inlet mechanism 3, a gaseous environment adjuster 4, a gas supply portion 6, a venting portion 7, a computer 8, and a communication unit 9. The body 1 of the instrument has a specimen chamber 2.

In the charged particle beam instrument 100, a specimen S can be observed in a gaseous atmosphere. In the charged particle beam instrument 100, the computer 8 issues instructions for opening and closing a gas inflow rate adjusting valve 40 (FIG. 2) of the gaseous environment adjuster 4, an instruction for introducing a gas, and other instructions to the communication unit 9. In response to such instructions, the communication unit 9 controls the gas inflow rate adjusting valve and performs other operations. Consequently, the pressure of gas inside the specimen chamber 2 can be controlled. The specimen S can be observed in a gaseous atmosphere.

Figure 2:
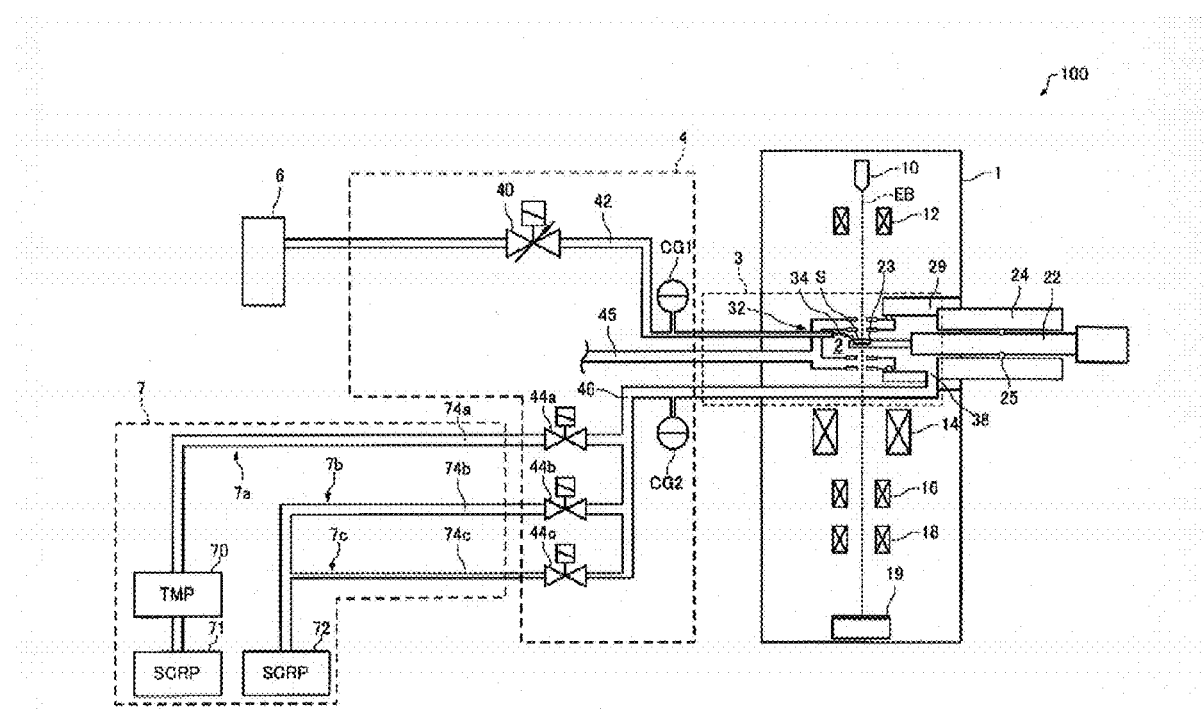
FIG. 2 is a detailed block diagram of the charged particle beam instrument shown in FIG. 1, depicting an electron optical column, a gas inlet mechanism, a gaseous environment adjuster, a gas supply portion, and a venting portion.

FIG. 2 shows the electron optical column 1, gas inlet mechanism 3, gaseous environment adjuster 4, gas supply portion 6, and venting portion 7.

1.1. Electron Optical Column

As shown in FIG. 2, the body (electron optical column) 1 of the charged particle beam instrument is configured including the specimen chamber 2, a charged particle beam source 10, an illumination lens 12, an objective lens 14, an intermediate lens 16, a projector lens 18, and an imaging device 19.

The charged particle beam source 10 emits a charged particle beam (such as an electron beam) EB. A well-known electron gun can be used as the charged particle beam source 10. No restrictions are imposed on the electron gun used as the charged particle beam source 10. For example, a thermionic electron gun, a thermal field-emission electron gun, a cold field emission gun, or the like can be used.

The illumination lens 12 is used to focus the electron beam EB generated by the charged particle beam source 10 and to direct the beam at the specimen S.

The objective lens 14 is located behind the illumination lens 12. The objective lens 14 is a first stage of lens for focusing the electron beam EB transmitted through the specimen S. For example, the objective lens 14 has a top polepiece and a bottom polepiece (not shown). The specimen chamber 2 is formed between the top and bottom polepieces.

The intermediate lens 16 is located behind the objective lens 14. The projector lens 18 is positioned behind the intermediate lens 16. The intermediate lens 16 and projector lens 18 further magnify the image focused by the objective lens 14 and focus the magnified image onto the imaging device 19.

The imaging device 19 captures the electron microscope image focused by the imaging system including the objective lens 14, intermediate lens 16, and projector lens 18. The imaging device 19 is configured, for example, including a CCD camera having a two-dimensional array of solid-state imaging elements. The imaging device 19 captures the electron microscope image and outputs information about this electron microscope image.

Furthermore, the electron optical column 1 can have a beam blanker (not shown) which temporarily cuts off the electron beam EB when the beam should not be directed at the specimen S, for example, when the pressure inside the specimen chamber 2 is controlled. The beam blanker is disposed, for example, between the charged particle beam source 10 and the illumination lens 12. The beam blanker cuts off the beam EB by bending the beam EB with a deflector (not shown) while the beam EB remains emitted from the charged particle beam source 10.

The specimen S is received in the specimen chamber 2. In the specimen chamber 2, the specimen S is held to a specimen holding portion 23 formed at a front end portion of a specimen holder 22, which in turn is mounted to a goniometer 24. The goniometer 24 permits movement and tilting of the specimen S held to the specimen holding portion 23. An annular groove is formed in the outer periphery of the specimen holder 22. An O-ring 25 is fitted in the groove. Sealing is provided between the specimen holder 22 and the goniometer 24 by the O-ring 25.

Gas is supplied into the specimen chamber 2 by the gas inlet mechanism 3. Consequently, it is possible to perform an in situ dynamic observation of the process of a reaction (such as an oxidation reaction or a reduction reaction) between the specimen S and the supplied gas, i.e., an in situ observation in a gaseous atmosphere.

1.2. Gas Inlet Mechanism

Figure 3:
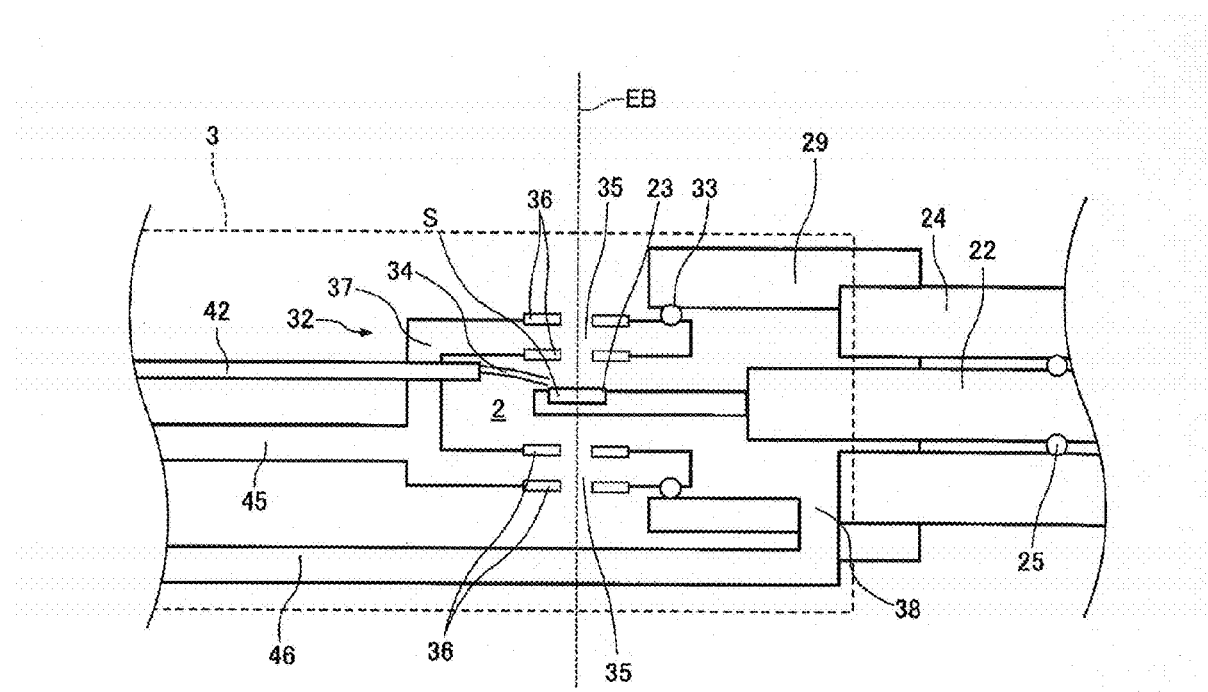
FIG. 3 is a vertical cross section of the gas inlet mechanism shown in FIG. 2.

FIG. 3 is an enlarged view of a part of FIG. 2, showing the gas inlet mechanism 3.

The gas inlet mechanism 3 is configured including a gas container 32, a gas inlet nozzle 34, orifices 36, and an exhaust pipe 38. The gas inlet mechanism 3 is of the retractable type. For example, when a normal observation is performed, the gas inlet mechanism 3 is off the optical axis. When gas is introduced into the specimen chamber 2, the gas inlet mechanism 3 is brought onto the optical axis and used. In the state shown in FIGS. 2 and 3, the gas inlet mechanism 3 is shown to be on the optical axis.

The gas container 32 is a receptacle for isolating the specimen chamber 2 from the other space inside the electron optical column 1. In the illustrated example, the gas container 32 is fitted in a container holder 29 securely fixed to the electron optical column 1 (goniometer 24). An annular groove is formed in the outer periphery of the gas container 32. An O-ring 33 is fitted in the groove. Sealing is provided between the gas container 32 and the container holder 29 by the O-ring 33.

Gas is introduced into the gas container 32 by the gas inlet nozzle 34, which is connected with a gas supply pipe 42. Gas supplied from the gas supply portion 6 (see FIG. 2) is introduced by the gas inlet nozzle 34 into the specimen chamber 2 via the gas supply pipe 42.

The upper and lower walls of the gas container 32 are provided with electron beam passage holes 35 permitting passage of the electron beam EB. The beam EB passes through the beam passage hole 35 formed in the upper wall of the gas container 32 and is directed at the specimen S. The beam EB transmitted through the specimen S passes through the electron beam passage hole 35 formed in the lower wall of the gas container 32 and enters the imaging system including the objective lens 14, intermediate lens 16, and projector lens 18.

The orifices 36 are formed respectively above and below the electron beam passage holes 35. An exhaust pipe 37 that connects the electron beam passage holes 35 with an orificed exhaust pipe 45 is mounted inside the gas container 32. This configuration permits formation of a differential-pressure space that isolates, in terms of pressure, the space inside the specimen chamber 2 from the other space in the electron optical column 1 where the charged particle beam source 10 and the optical system including the components 12, 14, 16, 18, and so on are arranged. Consequently, the pressure difference between the space inside the specimen chamber 2 and the other space inside the electron optical column 1 can be maintained.

The exhaust pipe 38 is used to vent the inside of the specimen chamber 2. In the illustrated example, the exhaust pipe 38 is connected with the container holder 29 and also with a specimen chamber exhaust pipe 46.

Figure 4:
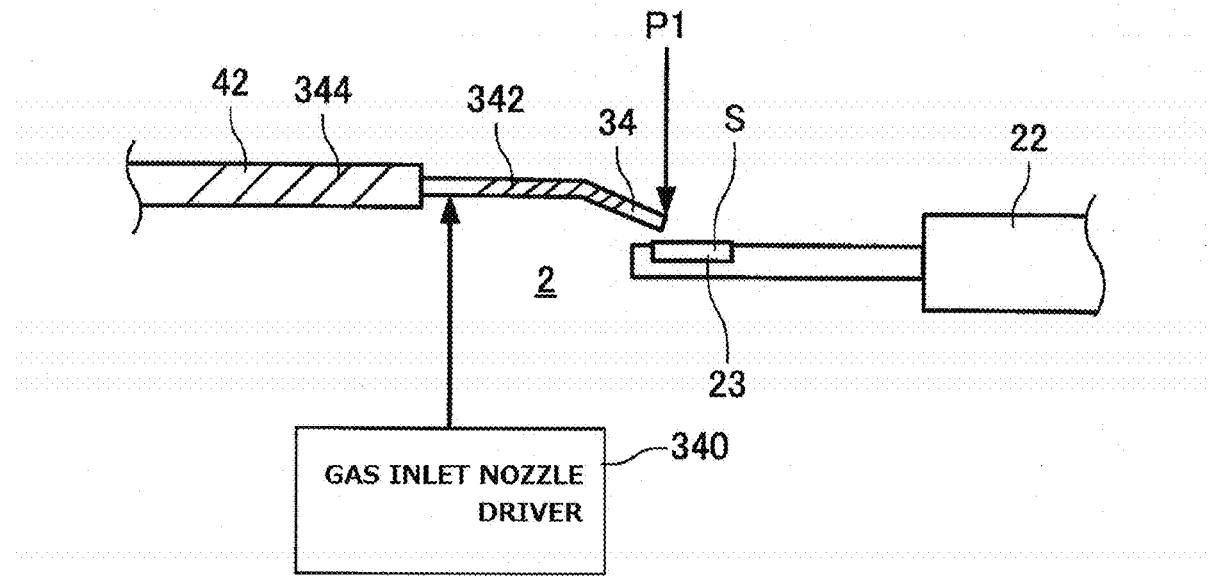
FIGS. 4 and 5 are vertical cross sections of the gas inlet nozzle shown in FIG. 2.
Figure 5:
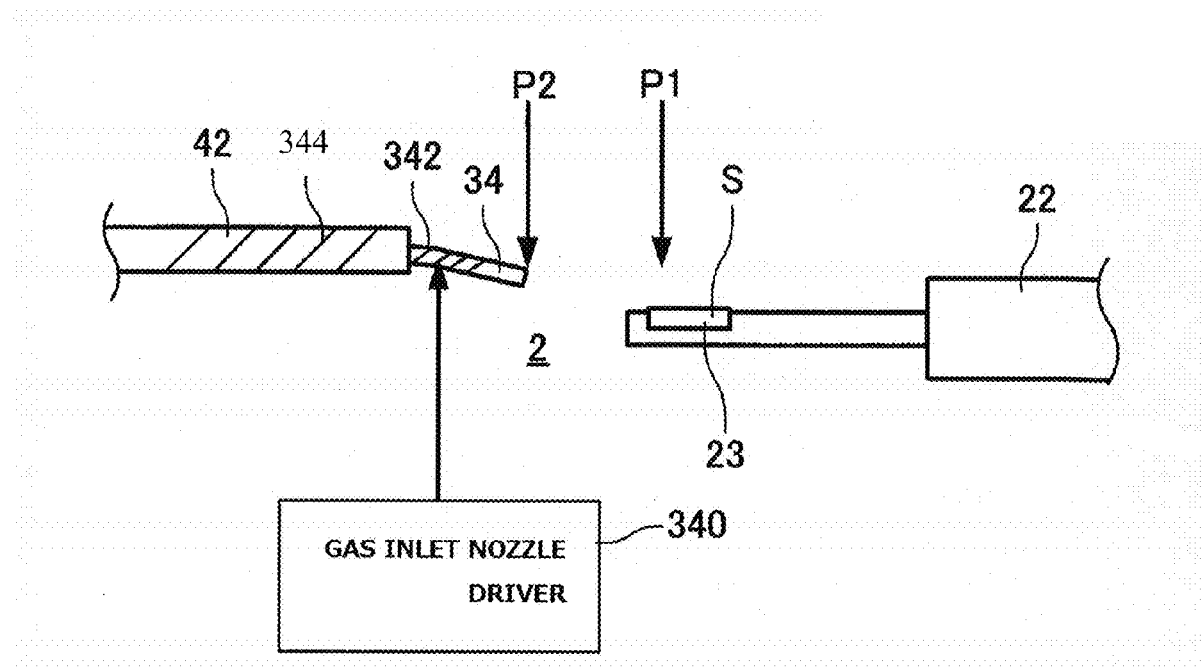

FIGS. 4 and 5 show the gas inlet nozzle 34. In the state shown in FIG. 4, the front end of the gas inlet nozzle 34 is at a first position P1. In the state shown in FIG. 5, the front end of the nozzle 34 is at a second position P2.

The gas inlet nozzle 34 has a hole at its front end. Gas supplied from the gas supply portion 6 is ejected from this hole of the nozzle 34. Since gas is supplied to the specimen S through the nozzle in this way, the gas can be blown against a narrow area. Therefore, the gas can be blown against a portion of the specimen S that the operator wants to observe. Consequently, a local area of higher pressure can be accomplished. Hence, scattering of the electron beam EB can be suppressed. That is, by introducing gas by the use of the gas inlet nozzle 34, the pressure in the vicinities of the specimen S can be made higher than the pressure in the other location in the specimen chamber 2.

The gas inlet mechanism 3 includes a gas inlet nozzle driver 340 (not shown in FIGS. 2 and 3) for moving the gas inlet nozzle 34.

The gas inlet nozzle driver 340 moves the gas inlet nozzle 34 between the first position P1 close to the specimen holding portion 23 holding the specimen S and the second position P2 more distant from the specimen holding portion 23 than the first position P1. When an in situ observation is performed, the gas inlet nozzle 34 is placed at the first position P1 and gas can be effectively blown against the specimen S. During gas purging, for example, using Ar gas, the gas inlet nozzle 34 is placed at the second position P2, and the gas inside the specimen 2 can be fully replaced by Ar gas without blowing Ar gas directly against the specimen S. The gas inlet nozzle driver 340 includes an electric motor (not shown). The gas inlet nozzle 34 is moved by operating the motor.

The gas inlet nozzle 34 has a heater 342 (not shown in FIGS. 2 and 3) for heating the nozzle 34. In the example of FIG. 4, the heater 342 is configured including heating wires mounted in the gas inlet nozzle 34. The heater 342 heats the gas inlet nozzle 34 by electrically energizing the heating wires. This in turn heats the gas introduced into the specimen chamber 2. When the charged particle beam instrument 100 is baked (heated), the gas inlet nozzle 34 can also be baked (heated). That is, the wall surface of the electron optical column 1 and other structures are heated to high temperatures to degas them. As a result, the charged particle beam instrument 100 can be maintained in a high vacuum. In the illustrated example, the gas supply pipe 42 similarly has a heater 344 for heating the gas supply pipe 42. Consequently, the gas introduced into the specimen chamber 2 can be heated. Furthermore, when the charged particle beam instrument 100 is baked, the gas supply pipe 42 can also be baked.

1.3. Gaseous Environment Adjuster

As shown in FIG. 2, the gaseous environment adjuster 4 is configured including the aforementioned gas inflow rate adjusting valve 40, the gas supply pipe 42, a first vacuum gauge CG1, exhaust valves 44a, 44b, 44c, exhaust pipes 45, 46, and a second vacuum gauge CG2.

The gas inflow rate adjusting valve 40 adjusts the flow rate of the gas supplied into the specimen chamber 2. The adjusting valve 40 is a variable valve capable of adjusting the flow rate of the gas, for example, by means of its degree of opening. The degree of opening of the gas inflow rate adjusting valve 40 is controlled by a gas controller 812 (see FIG. 6). The gas inflow rate adjusting valve 40 is mounted in the gas supply pipe 42.

The gas supply pipe 42 is used to connect together the gas supply portion 6 and the gas inlet nozzle 34. The gas inflow rate adjusting valve 40 is mounted on the side of the gas supply pipe 42 that is closer to the gas supply portion 6. The first vacuum gauge CG1 is mounted on the side of the gas supply pipe 42 that is closer to the gas inlet nozzle 34.

The first vacuum gauge CG1 measures the pressure of the gas supplied from the gas supply portion 6 into the specimen chamber 2. In the illustrated example, the first vacuum gauge CG1 measures the pressure inside the gas supply pipe 42 lying between the gas inflow rate adjusting valve 40 and the gas inlet nozzle 34. For example, the first vacuum gauge CG1 is a crystal gauge. Alternatively, other vacuum gauge may be used as the first vacuum gauge CG1. The reading of the first vacuum gauge CG1 is sent to the computer 8.

The exhaust valves 44a, 44b, and 44c are used to switchingly use the exhaust systems 7a, 7b, and 7c of the venting portion 7. In the illustrated example, the venting portion 7 has the three exhaust systems 7a, 7b, and 7c having different pumping capabilities. The operative exhaust system for venting the specimen chamber 2 can be switched between the exhaust systems 7a, 7b, and 7c using the exhaust valves 44a, 44b, and 44c. Each of the exhaust valves 44a, 44b, and 44c is a switch valve assuming a fully open state or a fully closed state. The exhaust valves 44a, 44b, and 44c are opened and closed under control of the gas controller 812 (see FIG. 6).

The orificed exhaust pipe 45 is used to connect together the exhaust pipe 37 of the gas container 32 and vacuum pumping system (not shown). Pipes and valves (none of which are shown) may be mounted to connect the orificed exhaust pipe 45 with pumping devices 70, 71, and 72 to vent the orifices 36 (see FIG. 3) using the pumping devices 70-72 of the venting portion 7.

The specimen chamber exhaust pipe 46 is used to connect the exhaust valves 44a, 44b, 44c with the exhaust pipe 38 of the gas container 32. The second vacuum gauge CG2 is mounted in the specimen chamber exhaust pipe 46.

The second vacuum gauge CG2 measures the pressure of the gas discharged from the specimen chamber 2. In the illustrated example, the second vacuum gauge CG2 measures the pressure inside the specimen chamber exhaust pipe 46. For instance, the second vacuum gauge CG2 is a crystal gauge. Other vacuum gauge may be used as the second vacuum gauge CG2. The reading of the second vacuum gauge CG2 is sent to the computer 8.

The gaseous environment adjuster 4 may have exhaust pipes and pumping devices (none of which are shown) for venting the interior of the gas supply pipe 42, the interior of the orificed exhaust pipe 45, and the interior of the specimen chamber exhaust pipe 46. Furthermore, there may be pipes and valves for venting the pipes 42, 45, and 46 inside the gas inlet mechanism 3 and in the gaseous environment adjuster 4 by means of the pumping devices 70, 71, and 72.

In addition, the gaseous environment adjuster 4 may have a plurality of vacuum gauges (not shown) for measuring the pressures inside the gas supply pipe 42 and exhaust pipes 45, 46.

1.4. Gas Supply Portion

The gas supply portion 6 supplies gas into the specimen chamber 2 via the gaseous environment adjuster 4. The gas supply portion 6 is connected with the gas supply pipe 42. The gas supply portion 6 can supply various species of gas into the specimen chamber 2. For example, the gas supply portion 6 supplies a gas for oxidizing the specimen S, a gas for deoxidizing the specimen S, a purge gas for purging the specimen chamber 2 and the gas supply pipe 42. For example, the gas supply portion 6 is configured including a plurality of gas cylinders and a switch for switching the connection between each gas cylinder and the gas supply pipe 42. The flow rate of the gas supplied from the gas supply portion 6 is adjusted by the gas inflow rate adjusting valve 40.

1.5. Venting Portion

The venting portion 7 vents the specimen chamber 2 via the gaseous environment adjuster 4. The venting portion 7 has plural (three in the illustrated example) exhaust systems 7a, 7b, 7c which are different in pumping capabilities. The venting portion 7 may have only one exhaust system or four or more exhaust systems (none of which are shown).

The exhaust system 7a is configured including the pumping device (such as a turbomolecular pump) 70, another pumping device (such as a scroll pump) 71, and an exhaust pipe 74a connected with the exhaust valve 44a. The exhaust system 7a has higher pumping capabilities than the exhaust systems 7b and 7c. The exhaust system 7a achieves high pumping capabilities by using the pumping device 70 (turbomolecular pump) of high pumping capabilities. The pumping device (scroll pump) 71 is used as an auxiliary pump.

The exhaust system 7b is configured including the pumping device (such as a scroll pump) 72 and an exhaust pipe 74b connected with the exhaust valve 44b.

The exhaust system 7c is configured including the pumping device (such as a scroll pump) 72 and an exhaust pipe 74c connected with the exhaust valve 44c.

The exhaust system 7b has higher pumping capabilities than the exhaust system 7c. The exhaust systems 7b and 7c share the same pumping device (scroll pump) 72 but the exhaust pipe 74b is greater in diameter than the exhaust pipe 74c, whereby the exhaust system 7b achieves higher pumping capabilities than the exhaust system 7c.

1.6. Computer

Figure 6:
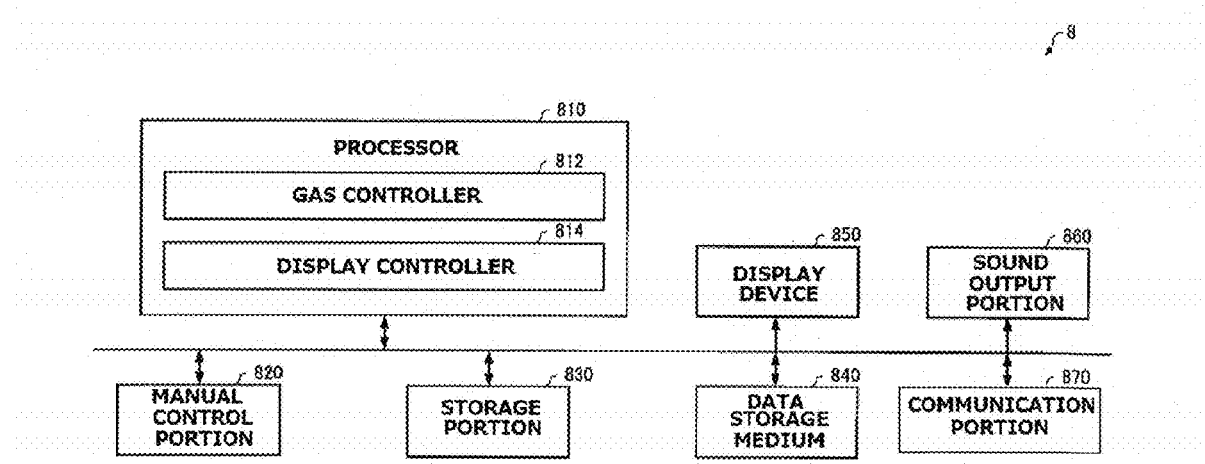
FIG. 6 is a block diagram of the computer shown in FIG. 1.

FIG. 6 illustrates the computer 8 which is used to control the gaseous environment adjuster 4 and the gas inlet mechanism 3. The computer 8 is configured including a processor 810, a manual control portion 820, a storage portion 830, a data storage medium 840, a display device 850, a sound output portion 860, and a communication portion 870.

The manual control portion 820 operates to obtain a control signal responsive to a user's action and to send the signal to the processor 810. The manual control portion 820 is made, for example, of buttons, keys, a touch panel display, or a microphone.

The storage portion 830 acts as a working area for both processor 810 and communication portion 870. Its function can be implemented in hardware such as a RAM.

The data storage medium 840 that is a computer-readable medium stores programs and data. The functions of the medium 840 can be implemented by hardware such as an optical disc (such as a CD or a DVD), a magnetooptical disc (MO), magnetic disc, hard disc, magnetic tape, or a memory (ROM).

Programs and data for operating the computer as the gas controller 812 and a display controller 814 of the present embodiment are stored in the data storage medium 840.

The processor 810 performs various processing operations of the present embodiment on the basis of a program stored in the data storage medium 840 and data read from the medium 840. That is, a computer program for operating the computer 8 as various constituent elements of the present embodiment is stored on the data storage medium 840.

The display device 850 outputs information (information about the operation of the gaseous environment adjuster 4) generated by the display controller 814 of the processor 810. The function of the display device 850 can be implemented in hardware such as a CRT display, an LCD (liquid crystal display), an OELD (organic electroluminescence display), a PDP (plasma display panel), a touch panel display, or the like.

The sound output portion 860 produces audible sound in response to a sound signal generated by the processor 810. The function of the sound output portion 860 can be implemented by hardware such as a loudspeaker or a headphone.

The communication portion 870 performs various control operations for performing communications with the communication unit 9 and other external device (such as a server or other terminal). The function of the communication portion 870 can be implemented by hardware (such as various processors or an ASIC (application-specific integrated circuit) used for communication purposes) or software.

The processor 810 performs various processing operations on the basis either of a manual control signal from the manual control portion 820 or of a computer program while using the storage portion 830 as a working area. The functions of the processor 810 can be implemented by hardware (such as various processors (e.g., a CPU or a DSP) or an ASIC (such as a gate array)) or by software.

The processor 810 is configured including the gas controller 812 and the display controller 814.

(1) Gas Controller

The gas controller 812 controls the gaseous environment adjuster 4. In particular, the gas controller 812 sets a target value of pressure for the gas supplied into the specimen chamber 2, based on a relational expression indicating the relationship between the reading of the first vacuum gauge CG1 and the pressure inside the specimen chamber 2 and on a corrective coefficient for correcting the reading of the first vacuum gauge CG1 according to the species of the gas supplied into the specimen chamber 2, and controls the gas inflow rate adjusting valve 40 such that the reading of the first vacuum gauge CG1 reaches the target value of pressure.

The relational expression indicating the relationship between the reading of the first vacuum gauge CG1 and the pressure inside the specimen chamber 2 is first described.

Figure 7:
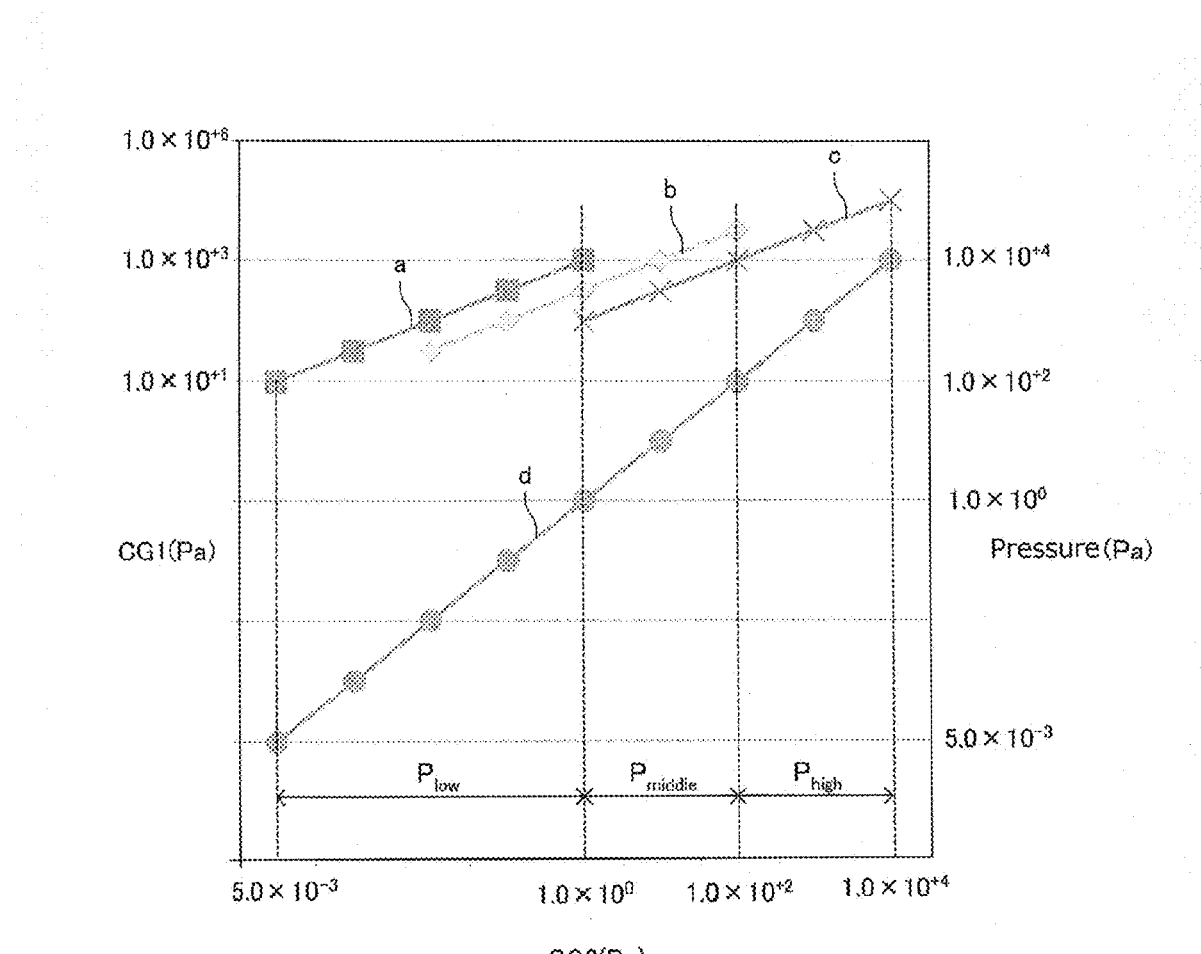
FIG. 7 is a graph showing the relationship between the pressure reading of the first vacuum gauge shown in FIG. 2 and the pressure reading of the second vacuum gauge shown in FIG. 2 and the relationship between a pressure (hereinafter may be referred to as the specimen pressure) measured near a specimen and the pressure reading of the second vacuum gauge.

FIG. 7 is a graph showing the relationship between the pressure reading of the first vacuum gauge CG1 and the pressure reading of the second vacuum gauge CG2 and the relationship between the pressure (herein referred to as the specimen pressure) in the vicinities of the specimen S (pressure inside the specimen chamber 2) and the pressure reading of the second vacuum gauge CG2.

The graph of FIG. 7 has been obtained from the readings of the first vacuum gauge CG1 and the readings of the second vacuum gauge CG2 when nitrogen ($N_2$) gas was introduced into the specimen chamber 2 of the charged particle beam instrument 100. The pressure in the vicinities of the specimen S was measured after attaching a device for pressure measurement to the specimen holder 22 and inserting the device into the specimen chamber 2. Pressure values measured in the vicinities of the specimen S and derived from the results of measurements using the device for pressure measurement are herein used as the values of the pressure inside the specimen chamber 2. Relational expressions a, b, c, and d have been found based on these results.

The relational expression a indicates the relationship between the pressure reading of the first vacuum gauge CG1 and the pressure reading of the second vacuum gauge CG2 when the specimen chamber 2 is vented by the exhaust system 7a. The relational expression b indicates the relationship between the pressure reading of the first vacuum gauge CG1 and the pressure reading of the second vacuum gauge CG2 when the specimen chamber 2 is vented by the exhaust system 7b. The relational expression c indicates the relationship between the pressure reading of the first vacuum gauge CG1 and the pressure reading of the second vacuum gauge CG2 when the specimen chamber 2 is vented by the exhaust system 7c. The relational expression d indicates the relationship between the pressure in the vicinities of the specimen S and the pressure reading of the second vacuum gauge CG2.

As shown in FIG. 7, the relationship between the pressure reading of the first vacuum gauge CG1 and the pressure reading of the second vacuum gauge CG2 are different among the exhaust systems 7a, 7b, and 7c. Therefore, in the charged particle beam instrument 100, ranges of pressures $P_{low}$, $P_{middle}$, and $P_{high}$ of pressure reading P of the second vacuum gauge CG2 for the exhaust systems 7a, 7b, and 7c are set according to the pumping capabilities of the exhaust systems 7a, 7b, and 7c.

In the example shown in FIG. 7, the pressure range $P_{low}$ using the exhaust system 7a is $5.0 \times 10^{-3} \leq P \leq 1.0 \times 10^{0}$. The pressure range $P_{middle}$ using the exhaust system 7b is $1.0 \times 10^{0} \leq P \leq 1.0 \times 10^{2}$. The pressure range $P_{high}$ using the exhaust system 7c is $1.0 \times 10^{2} < P \leq 1.0 \times 10^{4}$. That is, in the charged particle beam instrument 100, if the pressure reading P of the second vacuum gauge CG2 is in the pressure range $P_{low}$, the specimen chamber 2 is vented by the exhaust system 7a. If the pressure reading P of the second vacuum gauge CG2 is in the pressure range $P_{middle}$, the specimen chamber 2 is vented by the exhaust system 7b. If the pressure reading P of the second vacuum gauge CG2 is in the pressure range $P_{high}$, the specimen chamber 2 is vented by the exhaust system 7c. The pressure ranges are not restricted to the above-described example. Rather, they can be appropriately set according to the pumping capabilities of the exhaust systems 7a, 7b, and 7c.

Figure 8:
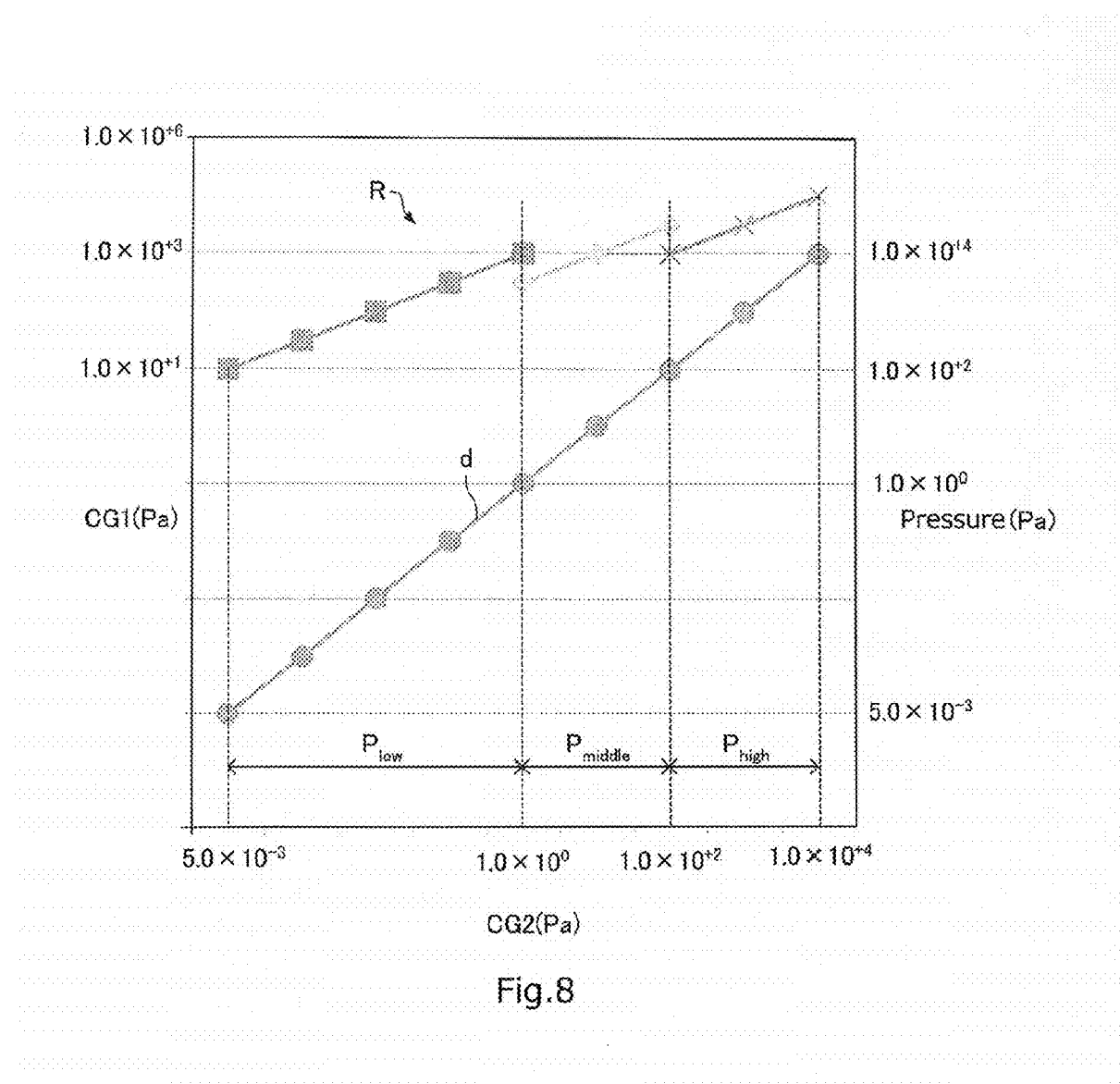
FIG. 8 is a graph showing the relationship between the pressure reading of the first vacuum gauge and the pressure reading of the second vacuum gauge and the relationship between the specimen pressure and the pressure reading of the second vacuum gauge in cases where pressure ranges $P_{low}$, $P_{middle}$, and $P_{high}$ are set.

FIG. 8 is a graph showing a relational expression R indicative of the relationship between the pressure reading of the first vacuum gauge CG1 and the pressure reading of the second vacuum gauge CG2 in a case where the pressure ranges $P_{low}$, $P_{middle}$, and $P_{high}$ using the exhaust systems 7a, 7b, and 7c as described previously are set. The pressure reading of the first vacuum gauge CG1 is determined from the pressure reading of the second vacuum gauge CG2 by using the relational expression R shown in FIG. 8. In this way, the relational expression R can uniquely determine the pressure reading of the first vacuum gauge CG1 from the pressure reading of the second vacuum gauge CG2. Similarly, the relational expression R can uniquely determine the pressure reading of the second vacuum gauge CG2 from the pressure reading of the first vacuum gauge CG1.

The use of the relational expression d makes it possible to determine the pressure (specimen pressure) in the vicinities of the specimen S from the pressure reading of the second vacuum gauge CG2. In this way, the relational expression d can uniquely determine the pressure in the vicinities of the specimen S from the pressure reading of the second vacuum gauge CG2. Similarly, the relational expression d can uniquely determine the pressure reading of the second vacuum gauge CG2 from the pressure in the vicinities of the specimen S. In the illustrated example, for the relational expression d, the relation, specimen pressure=pressure reading of the second vacuum gauge CG2, holds. The relational expression d is not restricted to this relation. The relational expression d can be various functions according to experimental results.

The pressure reading of the first vacuum gauge CG1 can be determined from the pressure in the vicinities of the specimen S by using the relational expressions R and d. Therefore, when it is desired to control the pressure in the vicinities of the specimen S to a desired pressure, this desired pressure can be achieved by calculating the target value of pressure of the gas supplied into the specimen chamber 2 using the relational expressions R and d and controlling the gas inflow rate adjusting valve 40 such that the pressure reading of the first vacuum gauge CG1 becomes equal to the target value of pressure.

The target value of pressure referred to herein is a target pressure reading of the first vacuum gauge CG1 when the pressure in the vicinities of the specimen S (inside the specimen chamber 2) is controlled. Where the pressure in the vicinities of the specimen S is controlled to a desired pressure, for example, the target value of pressure can be calculated from the desired pressure using a relational expression (such as the relational expression R or d) indicating the relationship between the pressure in the vicinities of the specimen chamber 2 and the pressure reading of the first vacuum gauge CG1.

The aforementioned relational expressions R and d hold when nitrogen gas is introduced into the specimen chamber 2. For other species of gas, the pressure can be controlled by correcting a target value of pressure using the corrective coefficient described below, the target value being found from the relational expressions R and d.

The corrective coefficient for correcting the pressure reading of the first vacuum gauge CG1 according to the species of gas supplied into the specimen chamber 2 is next described.

The measurement sensitivity of vacuum gauges (such as crystal gauges) used as the first vacuum gauge CG1 and the second vacuum gauge CG2 depends on the species of gas (molecular weight) of the measurement atmosphere.

Figure 9:
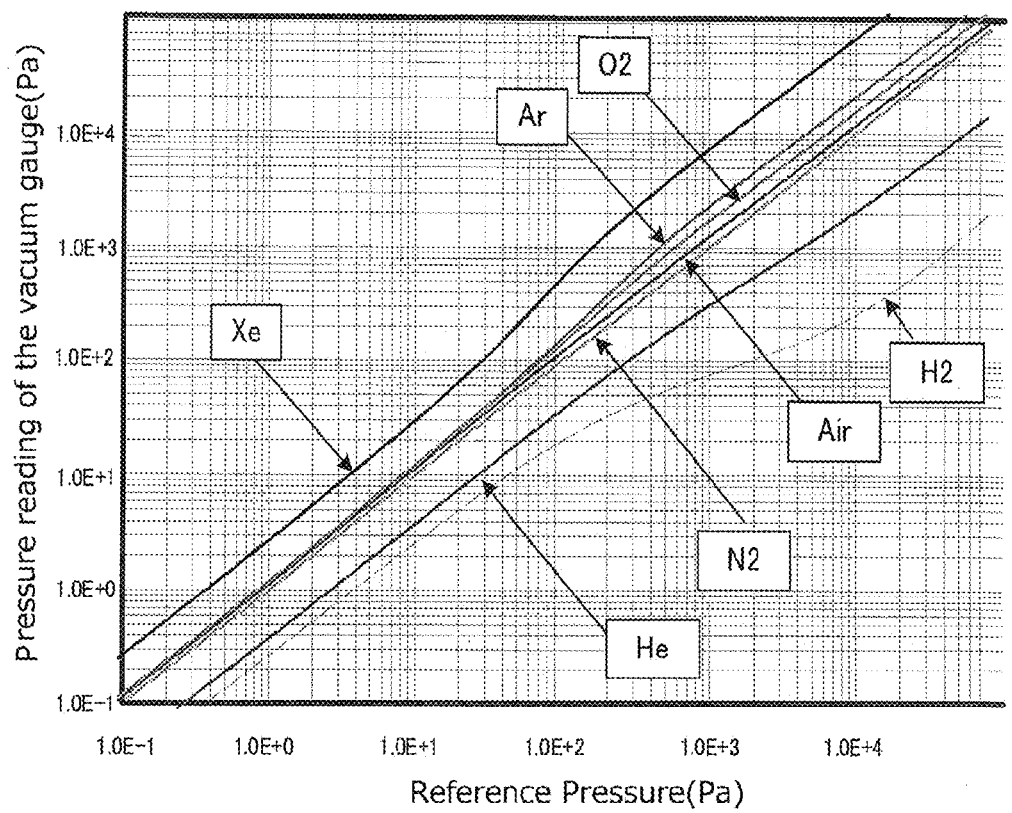
FIG. 9 is a graph showing examples of the relationship between the pressure reading of a crystal gauge and a reference pressure.

FIG. 9 is a graph showing examples of the relationship between the pressure reading of a crystal gauge and a reference pressure. In the examples shown in FIG. 9, there is a tendency that a gas having a smaller molecular weight gives a smaller pressure reading on the vacuum gauge, and vice versa.

The relational expressions R and d shown in FIG. 8 have been obtained for nitrogen gas. With respect to gases different in molecular weight from nitrogen gas, the target value of pressure obtained from the relational expressions R and d cannot be used intact as can be seen from the graph of FIG. 9. Accordingly, a target value of pressure corrected according to gas species is found using a corrective coefficient for correcting the reading of the first vacuum gauge CG1. Thus, the pressure in the vicinities of the specimen S can be controlled if the gas species (molecular weight) is different.

The corrective coefficient is used to correct the deviation of the reading of a vacuum gauge caused according to gas species (molecular weight). That is, the reading of the vacuum gauge is calibrated. The corrective coefficient is set, for example, on the basis of nitrogen gas. That is, the corrective coefficient for nitrogen gas is 1. A corrective coefficient is set for each gas (each molecular weight). A corrective coefficient may be set for each pressure range of each gas. That is, a plurality of corrective coefficients may be set according to plural pressure ranges of one gas. Also, these pressure ranges may be set according to molecular weight.

Furthermore, the corrective coefficient may be obtained from a graph showing examples of the relationship between the pressure reading of the vacuum gauge shown in FIG. 9 and a reference pressure.

Additionally, the corrective coefficient may be found from a relational expression indicating the relationship between the molecular weight of a gas and the sensitivity of the vacuum gauge. That is, the relational expression between the molecular weight of the gas and the sensitivity of the vacuum gauge is previously found. A corrective coefficient is found from this relational expression according to the gas species (molecular weight). The use of this relational expression makes it possible to obtain corrective coefficients for various gas species easily.

Figure 10:
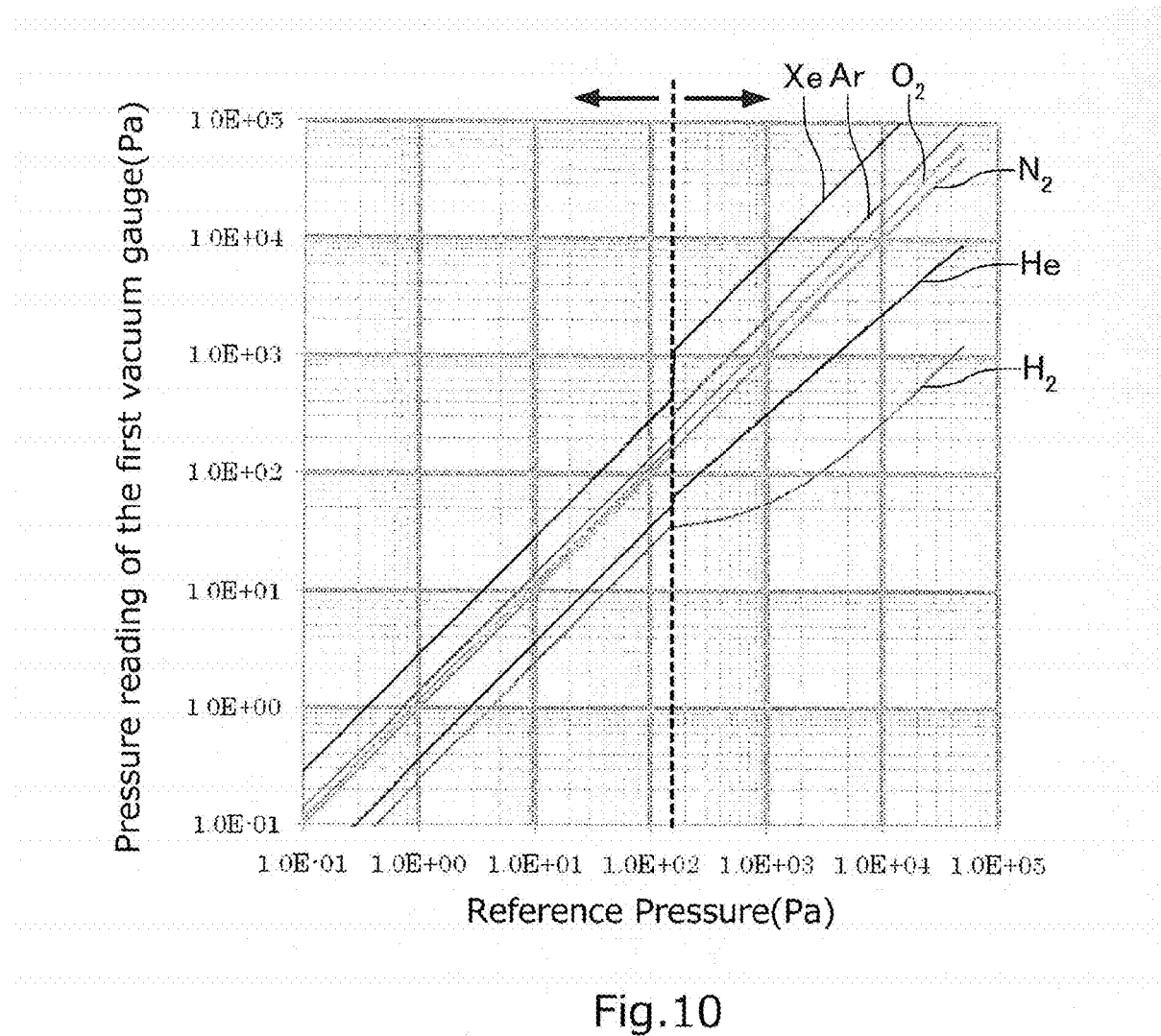
FIG. 10 is a graph created using an approximation formula when a corrective curve is approximated to compute a corrective coefficient.

Further, a corrective coefficient may be obtained, for example, by finding an approximation formula that reproduces a correction curve (calibration curve) indicating a relationship between the pressure reading of the vacuum gauge shown in FIG. 9 and a reference pressure. FIG. 10 is a graph created from an approximation formula used when a corrective coefficient was calculated while approximating a correction curve shown in FIG. 9.

In the example of FIG. 10, two pressure ranges separated by a pressure of 150 Pa are introduced, and an approximation is made. It can be seen from FIG. 10 that the correction curve indicating the relationship between the pressure reading of the vacuum gauge shown in FIG. 9 and a reference pressure is reproduced and that corrective coefficients for various gas species have been correctly obtained.

The relational expressions R, d, a corrective coefficients for each gas species, calculational formulas for finding corrective coefficients from molecular weights, and so on are stored, for example, in the storage portion 830 (see FIG. 6).

The operation of the gas controller 812 is next described in detail. When a user sets a pressure in the vicinities of the specimen S and a gas species supplied to the specimen S, the gas controller 812 finds a pressure reading of the second vacuum gauge CG2 from the set pressure (target value) near the specimen S, using the relational expression d indicating the relationship between the pressure in the vicinities of the specimen S and the pressure reading of the second vacuum gauge CG2. Then, the gas controller finds the target pressure reading of the first vacuum gauge CG1 from the found pressure reading of the second vacuum gauge CG2, using the relational expression R indicating the relationship between the pressure reading of the first vacuum gauge CG1 and the pressure reading of the second vacuum gauge CG2. Then, the gas controller corrects the found target pressure, using a corrective coefficient for the set gas species. The gas controller 812 then controls the gas inflow rate adjusting valve 40 such that the pressure reading of the first vacuum gauge CG1 reaches the corrected target value of pressure.

The gas controller 812 may find corrective coefficients on the basis of the molecular weight, for example, of nitrogen gas, using calculational formulas respectively for a first molecular weight range of molecular weight of 28 and higher and a second molecular weight range of molecular weights of less than 28. Furthermore, the gas controller 812 may set individual calculational formulas for finding corrective coefficients according to pressure ranges in the specimen chamber 2.

Where the gas controller 812 uses only the exhaust system 7a without switching the operative exhaust system between the exhaust systems 7a, 7b, and 7c, a target value of pressure can be calculated using the relational expressions a and d shown in FIG. 7.

Figure 11:
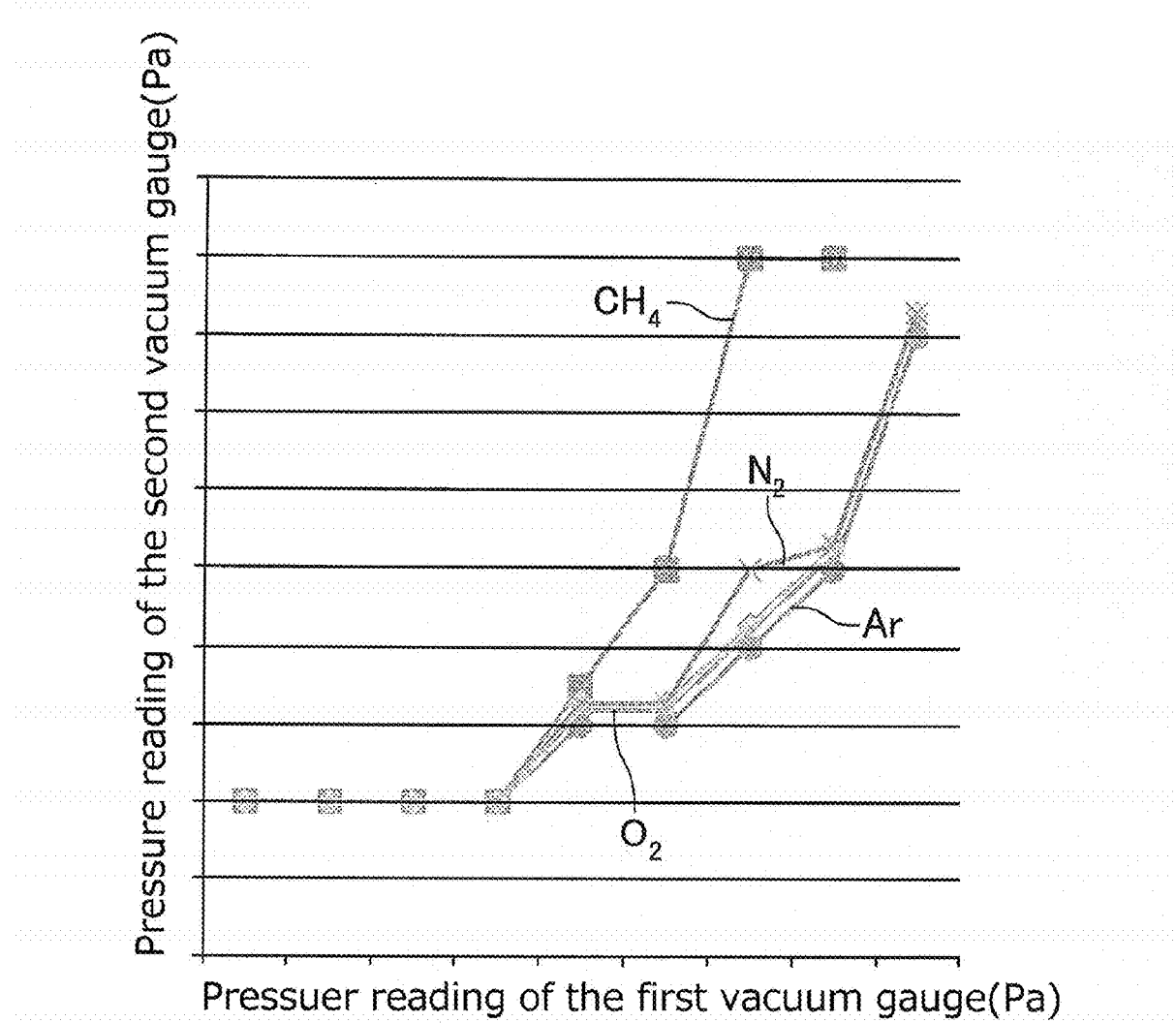
FIG. 11 is a graph showing examples of the relationship between the pressure reading of the first vacuum gauge and the pressure reading of the second vacuum gauge.

FIG. 11 is a graph showing examples of the relationship between the pressure reading of the first vacuum gauge CG1 and the pressure reading of the second vacuum gauge CG2. In the examples of FIG. 11, with respect to gases (Ar and $O_2$) having molecular weights greater than that of nitrogen gas, increases in the pressure reading of the second vacuum gauge CG2 in response to the same input gas pressure (pressure reading of the first vacuum gauge CG1) are not as great as the increase for nitrogen gas. With respect to a gas ($CH_4$) having a molecular weight smaller than that of nitrogen gas, an increase in the pressure reading of the second vacuum gauge CG2 in response to the same input gas pressure (pressure reading of the first vacuum gauge CG1) is greater than the increase for nitrogen gas.

A relational expression indicating a relationship with a molecular weight may be found for each pressure range from the graph of FIG. 11 and a corrective coefficient may be calculated.

Furthermore, the gas controller 812 operates to switch the operative exhaust system between the exhaust systems 7a, 7b, and 7c on the basis of the reading of the second vacuum gauge CG2 by controlling the exhaust valves 44a, 44b, and 44c.

More specifically, the gas controller 812 vents the specimen chamber 2 using the exhaust system 7a in a case where the pressure reading P of the second vacuum gauge CG2 is in the pressure range $P_{low}$ ($5.0 \times 10^{-3} \leq P \leq 1.0 \times 10^0$). The gas controller vents the specimen chamber 2 using the exhaust system 7b in a case where P is in the pressure range $P_{middle}$ ($1.0 \times 10^0 < P \leq 1.0 \times 10^2$). The gas controller vents the specimen chamber 2 using the exhaust system 7c in a case where P is in the pressure range $P_{high}$ ($1.0 \times 10^2 < P \leq 1.0 \times 10^4$). In this way, the gas controller controls the exhaust valves 44a, 44b, and 44c. The pressure ranges are not restricted to the above example. Rather, the ranges can be appropriately set according to the pumping capabilities of the exhaust systems 7a, 7b, and 7c.

(2) Display Controller

The display controller 814 (see FIG. 6) displays the operational information about the gaseous environment adjuster 4 on the display device 850. In particular, the display controller 814 provides control based on the readings of the first vacuum gauge CG1 and the second vacuum gauge CG2 such that at least one type of information selected from the group consisting of information about the species of the gas in the pipes 42, 45, 46, 74a, 74b, and 74c (see FIG. 2) through which the gas supplied from the gas supply portion 6 and the gas expelled from the specimen chamber 2 pass, information about the flows of the gases, and information about the gas remaining in the pipes 42, 45, 46, 74a, 74b, and 74c on the display device 850.

Figure 12:
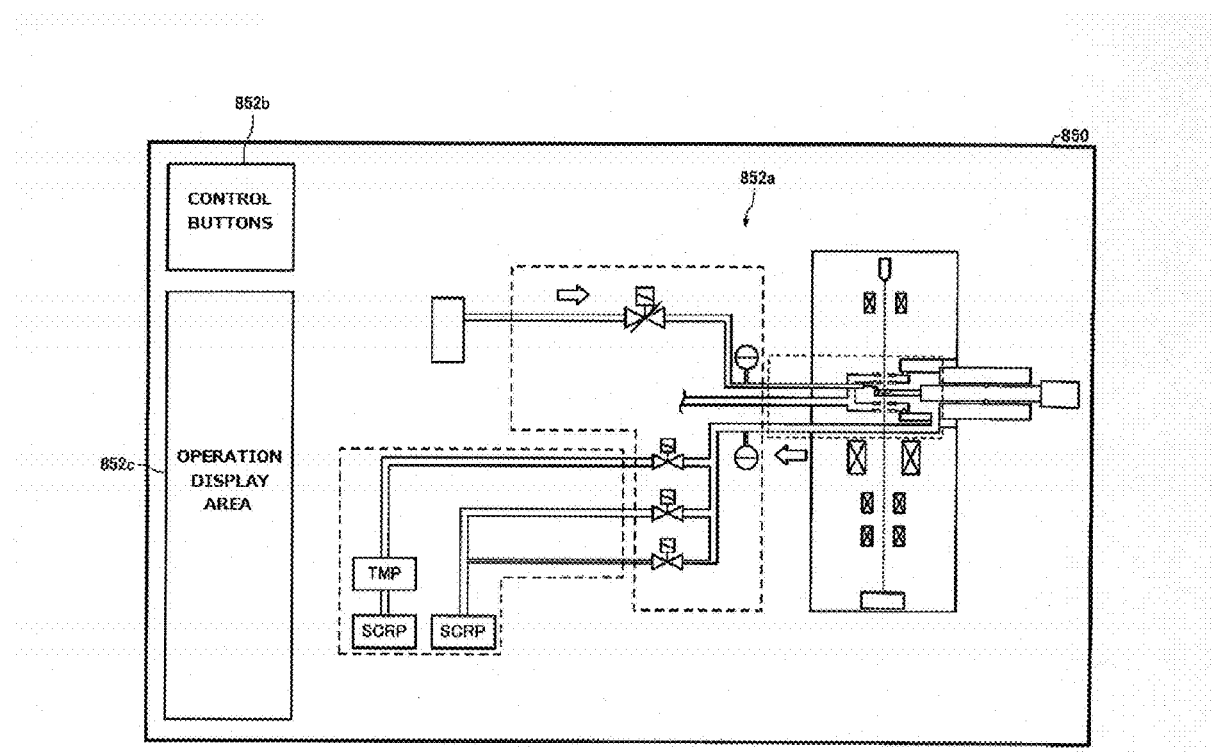
FIG. 12 shows one example of a control GUI (graphical user interface) screen of the charged particle beam instrument shown in FIG. 1.

FIG. 12 shows one example of control GUI (graphical user interface) screen of the charged particle beam instrument 100.

The display controller 814 creates the control GUI screen shown in FIG. 12. The human operator of the charged particle beam instrument 100 manipulates the control GUI screen shown in FIG. 12 and a control panel of the manual control portion 820 to control the gaseous environment adjuster 4, thus introducing gas into the specimen chamber 2.

An operational state display area 852a indicating the states of the gaseous environment adjuster 4 and of the body (electron optical column) 1 of the charged particle beam instrument is displayed on the control GUI screen. Furthermore, control buttons 852b for controlling the gaseous environment adjuster 4 and an operation display area 852c for displaying details of an operation are displayed on the control GUI screen.

The control GUI screen shown in FIG. 12 has the following features.

As shown in FIG. 2, the gaseous environment adjuster 4 is configured including the gas inflow rate adjusting valve 40, gas supply pipe 42, vacuum gauges CG1, CG2, exhaust valves 44a, 44b, 44c, and exhaust pipes 45, 46. It is important that the operator be meticulously informed of how gas is introduced into the gaseous environment adjuster 4, how gas is vented, and numerical values.

The control GUI screen shown in FIG. 12 shows various states in different colors. In one state, the piping inside the gaseous environment adjuster 4 is being vented. In another state, gas is being introduced. In a further state, gas remains in the internal piping. There is an additional state. Furthermore, during venting, the state is displayed in a different color according to which of the exhaust systems 7a, 7b, and 7c is used. Any valve operation permitting simultaneous use of plural ones of the different exhaust systems 7a, 7b, and 7c is inhibited to ensure safety.

During introduction of a gas, the state is displayed in a different color according to a different gas species. This permits the operator to know the gas species at a glance. The direction of flow of the gas is indicated by an arrow marked near the piping and so the direction of delivery of the gas can also be confirmed. During introduction of a gas, the manner in which the gas is delivered from the gas inlet nozzle 34 is also portrayed.

The state in which gas stays in the pipes 42, 45, 46, 74a, 74b, and 74c is displayed differently from the state in which gas is being introduced. Therefore, the operator can be informed of what kind of gas was introduced in the past. This can prompt the operator to perform a venting operation. A state in which a remaining gas produced in the past has mixed with another remaining gas due to a valve operation is displayed in a color different from the color denoting the state in which there is only residual gas.

The display controller 814 can display the monitoring GUI screen of the above-mentioned function independently of the control GUI screen (FIG. 12). The monitoring GUI screen can be activated at any time, for example, from the control GUI screen. Especially, a case in which gas is introduced is used most frequently. Therefore, a launcher function is provided in a screen for setting the pressure in the vicinities of the specimen S at a desired value to prevent the operator from missing activating the monitoring GUI screen.

Figure 13:
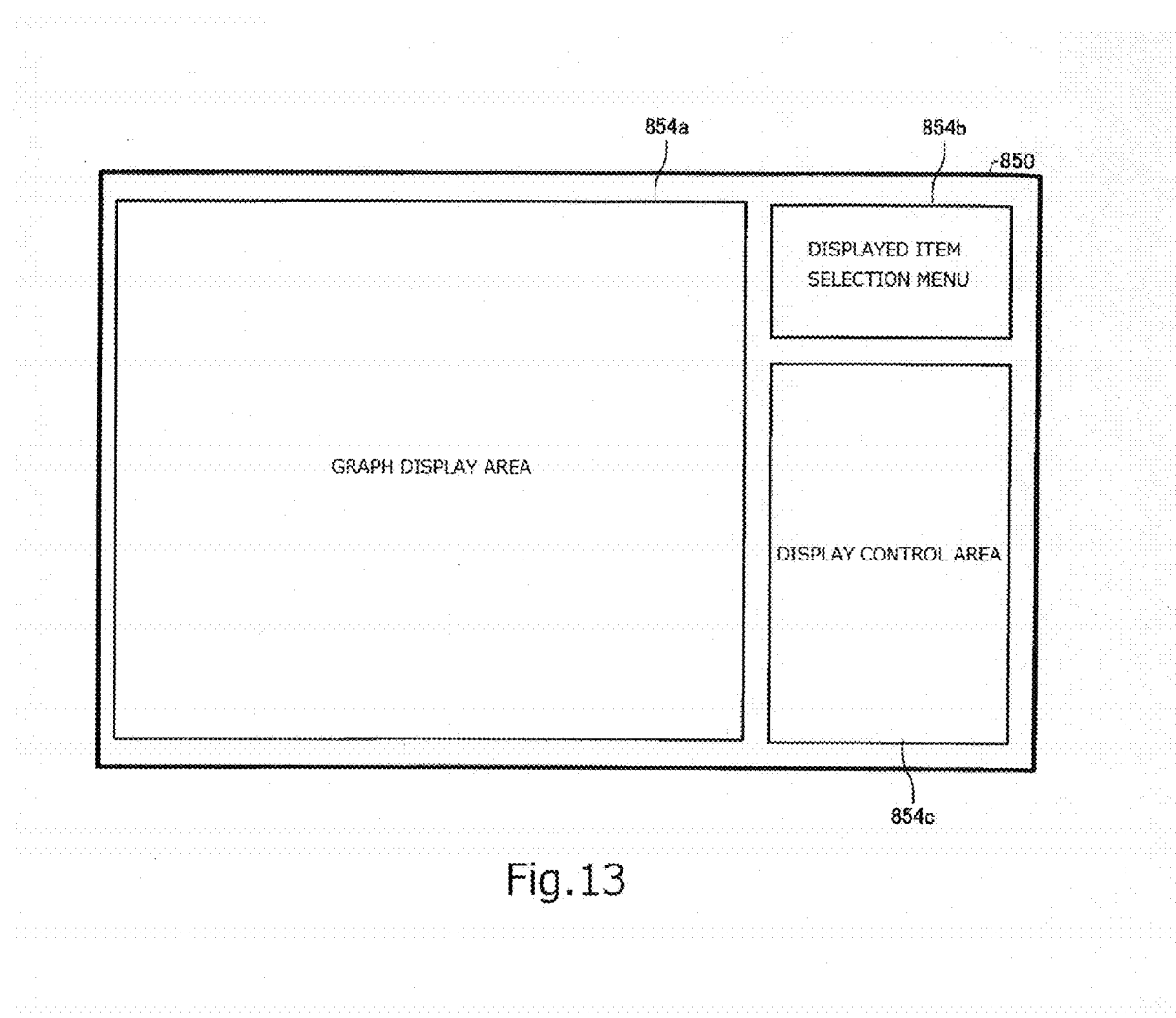
FIG. 13 shows one example of a monitoring GUI screen of the charged particle beam instrument shown in FIG. 1.

FIG. 13 shows one example of the monitoring GUI screen of the charged particle beam instrument 100.

Information about timewise variations of the pressure readings of the first vacuum gauge CG1 and second vacuum gauge CG2 is displayed as graphs by the display controller 814 in a graph display area 854a shown in FIG. 13. In each of these graphs, time is plotted on the horizontal axis, and pressure is plotted on the vertical axis. Furthermore, the display controller 814 displays, in the graph display area 854a, a displayed item selection menu 854b permitting one to select items to be displayed. In addition, the display controller 814 displays a display control area 854c for enlarging or reducing the display provided by the graph display area 854a.

If numeral values derived from vacuum gauges and flowmeters can be checked and recorded over a long term, then useful information leading to identification of the location either of a vacuum leak that might occur in the gaseous environment adjuster 4 or of a fault would be obtained. Moreover, if timewise variations of numerical values derived from vacuum gauges during gas introduction or timewise variations of numeral values during venting can be checked on graphs, then improved usability will be provided.

The monitoring GUI screen shown in FIG. 13 has the following features.

By selecting an item from the displayed item selection menu 854b, items to be recorded can be selected at will. By recording only items of interest, an operation for sorting data later can be performed smoothly.

During gas introduction, information about a comparison between a desired pressure in the vicinities of the specimen S and the present value can be displayed in the graph display area 854a. During gas introduction, a comparison between a desired pressure in the vicinities of the specimen S and the present value permits one to roughly know a forecastable time of arrival because graphical waveforms are compared. This can provide quite useful information.

In this way, the display controller 814 provides control such that information about timewise variations of the pressure readings of the first vacuum gauge CG1 and second vacuum gauge CG2 is displayed on the display device 850 as shown in FIG. 13.

Data derived from vacuum gauges can be analyzed in detail by external computer software. The monitoring GUI screen outputs data used for this purpose to the computer at all times. If numerous computer files exist in the same holder, it is difficult to discover a desired data item. Therefore, where data is started to be stored, a contrivance for adding an arbitrary comment to a file name is introduced. Therefore, if it is necessary to extract data later, data items having file names to which the set comment is added should be extracted. This results in an improvement of the work.

The display controller 814 obtains information about the species of the gas in the pipes 42, 45, 46, 74a, 74b, and 74c, information about the flow of the gas, and the information about the gas remaining in these pipes 42, 45, 46, 74a, 74b, and 74c from the readings of the first vacuum gauge CG1 and second vacuum gauge CG2. Alternatively, these kinds of information may be obtained from measuring instruments (not shown) other than the vacuum gauges CG1 and CG2.

2. Method of In Situ Observation
2.1. Method of In Situ Observation

Figure 14:
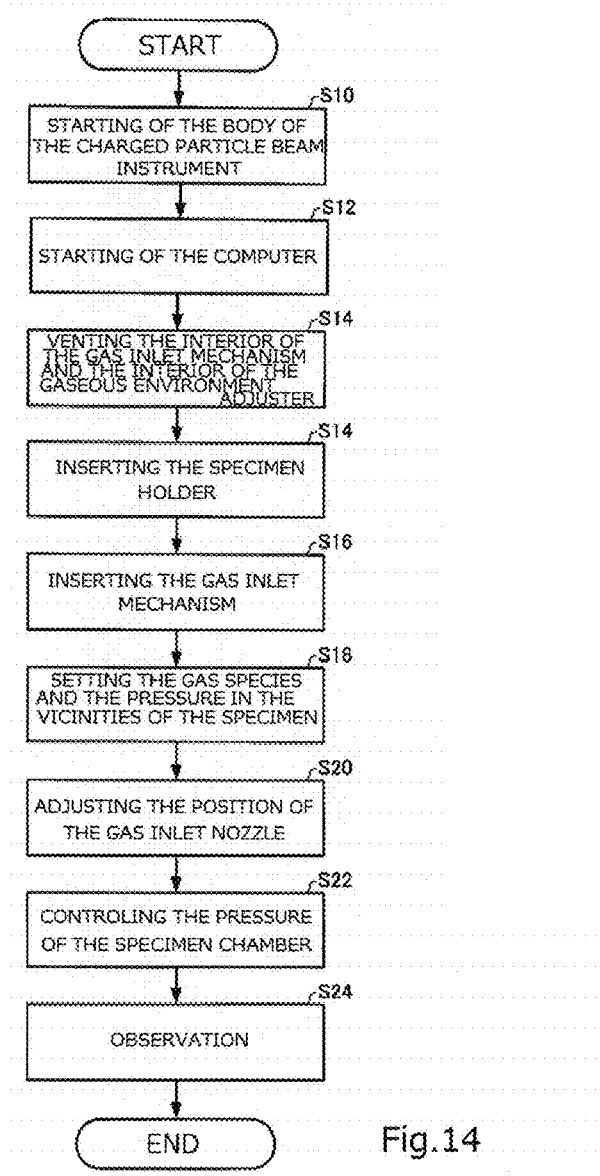
FIG. 14 is a flowchart illustrating a subroutine for performing an in situ observation according to the invention.

A method of in situ observation according to the present embodiment of the invention in a gaseous atmosphere is next described by referring to the flowchart of FIG. 14, which illustrates one example of the method of in situ observation in a gaseous atmosphere.

First, the body (electron optical column) 1 of the charged particle beam instrument is set into operation (step S10).

The computer 8 is then started (step S12). Consequently, a dedicated recipe for shifting the mode of operation to a gaseous atmosphere mode is read, for example, from the storage portion 830, and the instrument shifts to the gaseous atmosphere mode.

Then, the interior of the gas inlet mechanism 3 and the interior of the gaseous environment adjuster 4 are vented (step S14). Gas remaining in the pipes 42, 45, and 46 (see FIG. 2) in the gas inlet mechanism 3 and gaseous environment adjuster 4 is vented in accordance with a dedicated venting recipe.

Then, the specimen holder 22 is inserted (step S14). In particular, the specimen S is held to the specimen holding portion 23 of the specimen holder 22. The specimen holder 22 is inserted in the hole that is formed in the goniometer 24 and in communication with the interior of the electron optical column 1 (see FIG. 2).

Then, the gas inlet mechanism 3 is inserted into the optical axis (step S16). Specifically, the gas inlet mechanism 3 is moved such that the electron beam EB can pass through the electron beam passage holes 35 in the gas container 32.

The gas species introduced into the specimen chamber 2 and the pressure in the vicinities of the specimen S are then set by the user, for example, via the manual control portion 820 (step S18). Information about the set gas species and information about the pressure in the vicinities of the specimen S is stored, for example, in the storage portion 830.

Then, the position of the gas inlet nozzle 34 is adjusted (step S20). In particular, the gas inlet nozzle driver 340 is controlled to move the gas inlet nozzle 34 to bring the front end of the gas inlet nozzle 34 into the first position P1 (see FIG. 4). As a result, gas can be blown against the specimen S effectively.

Then, the pressure in the vicinities of the specimen S is controlled (step S22). Specifically, the gas controller 812 (see FIG. 6) controls the gaseous environment adjuster 4 such that the pressure in the vicinities of the specimen S reaches the preset pressure value. This will be described in further detail later.

The electron beam EB is blanked by the beam blanker (not shown) to prevent the specimen S from being irradiated with the electron beam EB until the pressure in the vicinities of the specimen S reaches the preset pressure value (i.e., until the pressure reading of the first vacuum gauge CG1 reaches the preset pressure value).

When the pressure in the vicinities of the specimen S reaches the preset pressure value (i.e., when the pressure reading of the first vacuum gauge CG1 reaches the preset pressure value), the beam blanking is deactivated, permitting an in situ observation (step S24). Consequently, an in situ observation in a gaseous atmosphere can be performed.

2.2. Operation of Gas Controller

Step S22 for controlling the pressure in the vicinities of the specimen S is next described. This step S22 is carried out by controlling the gas inflow rate adjusting valve 40 and exhaust valves 44a, 44b, and 44c under control of the gas controller 812.

(1) Control of Gas Inflow Rate Adjusting Valve

Step S22 for controlling the pressure in the vicinities of the specimen S includes an operation in which the gas controller 812 controls the gas inflow rate adjusting valve 40. An example in which the target value of pressure is not corrected, i.e., the gas supplied into the specimen chamber 2 is nitrogen gas, is described here.

Figure 15:
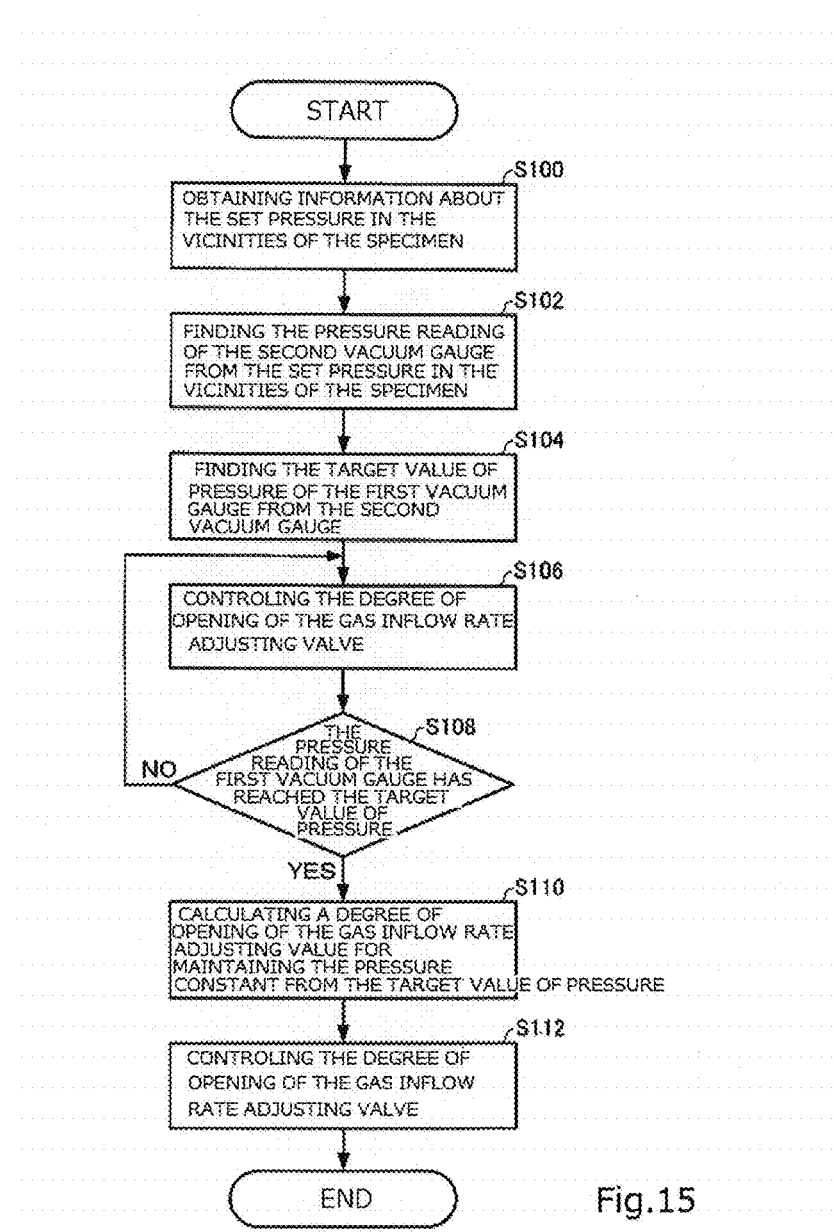
FIG. 15 is a flowchart illustrating a subroutine for controlling a gas inflow rate adjusting valve of a gas controller included in the charged particle beam instrument shown in FIG. 1.

FIG. 15 is a flowchart illustrating one example of subroutine for controlling the gas inflow rate adjusting valve 40 of the gas controller 812.

The gas controller 812 obtains information about the set pressure in the vicinities of the specimen S, the pressure being stored in the storage portion 830 (step S100).

Then, the gas controller 812 finds the pressure reading of the second vacuum gauge CG2 from the set pressure in the vicinities of the specimen S, using the relational expression d (shown in FIG. 8) indicating the relationship between the pressure in the vicinities of the specimen S and the pressure reading of the second vacuum gauge CG2 (step S102).

Then, the gas controller 812 finds the pressure reading (target value of pressure) of the first vacuum gauge CG1 from the second vacuum gauge CG2 found at step S102, using the relational expression R (shown in FIG. 8) indicating the relationship between the pressure reading of the first vacuum gauge CG1 and the pressure reading of the second vacuum gauge CG2 (step S104).

Then, the gas controller 812 controls the degree of opening of the gas inflow rate adjusting valve 40 such that the pressure reading of the first vacuum gauge CG1 reaches the target value of pressure (step S106). The gas controller 812 controls the gas inflow rate adjusting valve 40 on the basis of the pressure reading of the first vacuum gauge CG1. No restriction is imposed on the method of controlling the gas inflow rate adjusting valve 40. For example, the valve may be controlled by PID (proportional-integral-derivative) control.

The gas controller 812 makes a decision as to whether the pressure reading of the first vacuum gauge CG1 has reached the target value of pressure, based on the pressure reading of the first vacuum gauge CG1 (step S108).

If the decision at step S108 is NO, indicating that the pressure reading of the first vacuum gauge CG1 has not reached the target value of pressure, the gas controller 812 controls the degree of opening of the gas inflow rate adjusting valve 40 such that the pressure reading of the first vacuum gauge CG1 reaches the target value of pressure (step S106).

If the decision at step S108 is YES, indicating that the pressure reading of the first vacuum gauge CG1 has reached the target value of pressure, the gas controller 812 calculates a degree of opening of the gas inflow rate adjusting valve 40 for maintaining the pressure constant from the target value of pressure (step S110).

The gas controller 812 controls the degree of opening of the gas inflow rate adjusting valve 40 on the basis of the results of calculation performed at step S110 (step S112). Consequently, the flow rate of the gas supplied into the specimen chamber 2 can be maintained at a flow rate equivalent to the target value of pressure. The pressure in the vicinities of the specimen S can be brought to the set pressure value.

For example, if the user enters an instruction for ending the in situ observation via the manual control portion 820, the gas controller 812 ends the subroutine.

(2) Modification of Control of Gas Inflow Rate Adjusting Valve

In the above-described subroutine illustrated in FIG. 15, an example in which the target value of pressure is not corrected is described. In the present modification, an example in which the target value of pressure is corrected (i.e., a gas other than nitrogen gas is supplied into the specimen chamber 2) is described.

Figure 16:
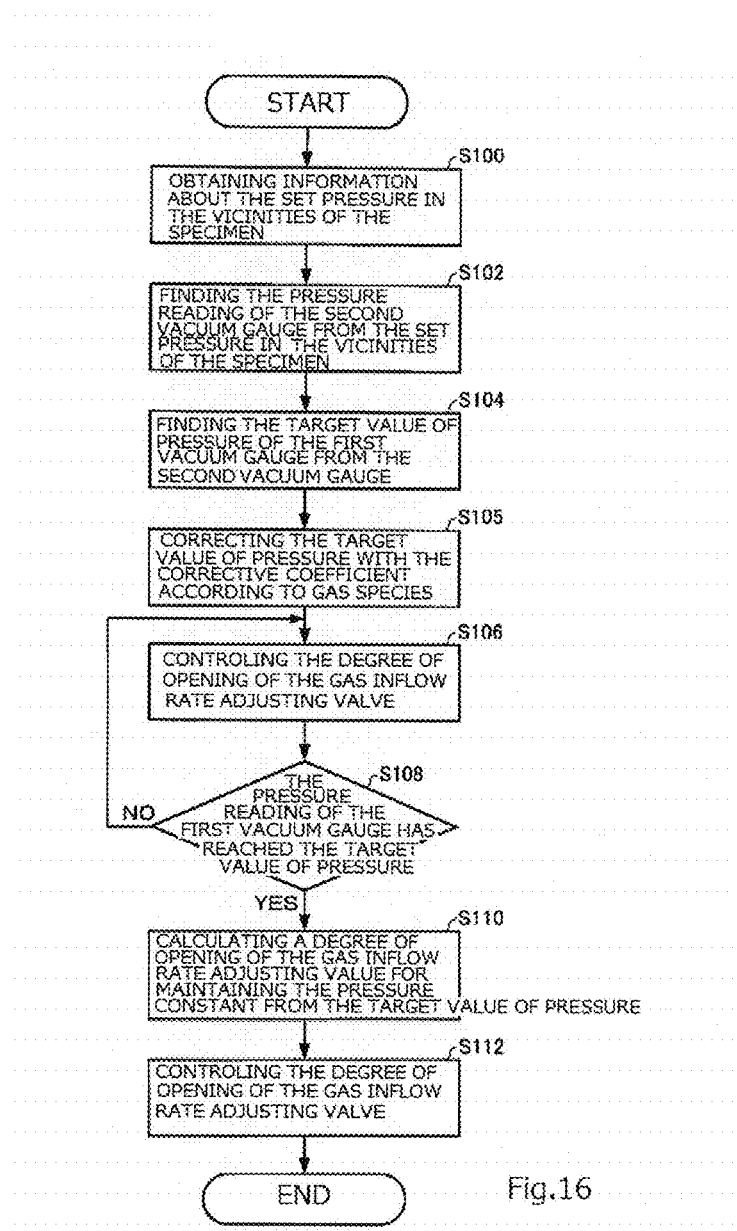
FIG. 16 is a flowchart illustrating a modified subroutine for controlling the gas inflow rate adjusting valve of the gas controller of the charged particle beam instrument shown in FIG. 1.

FIG. 16 is a flowchart illustrating a modified subroutine for controlling the gas inflow rate adjusting valve 40 under control of the gas controller 812. Only the differences with the subroutine illustrated in FIG. 15 are described; similar operations are indicated by the same reference numerals and a description thereof is omitted.

In the present embodiment, as illustrated in FIG. 16, the gas controller 812 corrects the target value of pressure found at step S104 with the corrective coefficient for correcting the pressure reading of the first vacuum gauge CG1 according to gas species after step S104 for finding the target value of pressure (step S105). Information about the corrective coefficient is stored, for example, in the storage portion 830. The gas controller 812 obtains the information about the corrective coefficient from the storage portion 830.

(3) Control of Venting Portion

Step S22 for controlling the pressure in the vicinities of the specimen S includes an operation for controlling the exhaust valves 44a, 44b, and 44c under control of the gas controller 812. This operation is next described.

FIG. 17 is a flowchart illustrating one example of subroutine for controlling the exhaust valves 44a, 44b, and 44c under control of the gas controller 812.

The gas controller 812 opens the gas inflow rate adjusting valve 40 to start to supply a gas (step S200). This step S200 corresponds to step S106 illustrated in FIG. 15.

The gas controller 812 makes a decision as to whether the pressure reading P of the second vacuum gauge CG2 is in the pressure range $P_{low}$ ($5.0 \times 10^{-3} \leq P \leq 1.0 \times 10^{0}$) (step S202).

If the decision at step S202 is YES, indicating that the pressure reading of the second vacuum gauge CG2 is in the pressure range $P_{low}$, the gas controller 812 opens the exhaust valve 44a shown in FIG. 2, closes the exhaust valves 44b and 44c, and vents the specimen chamber 2 by the exhaust system 7a (step S204).

If the decision at step S202 is NO, indicating that the pressure reading of the second vacuum gauge CG2 is not in the pressure range $P_{low}$, the gas controller 812 makes a decision as to whether the pressure reading of the second vacuum gauge CG2 is in the pressure range $P_{middle}$ ($1.0 \times 10^{-3} < P \leq 1.0 \times 10^{2}$) (step S206).

If the decision at step S206 is YES, indicating that the pressure reading of the second vacuum gauge CG2 is in the pressure range $P_{middle}$, the gas controller 812 opens the exhaust valve 44b shown in FIG. 2, closes the exhaust valves 44a, 44c, and vents the specimen chamber 2 by the exhaust system 7b (step S208).

If the decision at step S206 is NO, indicating that the pressure reading of the second vacuum gauge CG2 is not in the pressure range $P_{middle}$, then the gas controller 812 makes a decision as to whether the pressure reading of the second vacuum gauge CG2 is in the pressure range $P_{high}$ ($1.0 \times 10^{2} < P \leq 1.0 \times 10^{4}$) (step S210).

If the decision at step S210 is YES, indicating that the pressure reading of the second vacuum gauge CG2 is in the pressure range $P_{high}$, the gas controller 812 controls the exhaust system (not shown) for venting the gas supply pipe 42 shown in FIG. 2, thus venting the gas supply pipe 42 (step S212). Consequently, this prevents gas from pouring into the specimen chamber 2 if the pumping capabilities of the exhaust system drop; otherwise, the pressure inside the specimen chamber 2 would rise violently. Then, the gas controller 812 opens the exhaust valve 44c, closes the exhaust valves 44a, 44b, and vents the specimen chamber 2 by the exhaust system 7c (step S214).

If the decision at step S210 is NO, indicating that the pressure reading of the second vacuum gauge CG2 is not in the pressure range $P_{high}$, and if steps S204, S208, and S214 have ended, then the gas controller 812 makes a decision as to whether the user has entered an instruction for ending the in situ observation via the manual control portion 820 (step S216).

If the decision at step S216 is NO, indicating that any instruction for ending the in situ observation has not been entered, the gas controller 812 returns to step S202 and performs steps S204-S216.

If the decision at step S216 is YES, indicating that an instruction for ending the observation has been entered, the gas controller 812 ends the subroutine.

(4) Operation for Reducing Pressure in Specimen Chamber

Where the pressure in the vicinities of the specimen S is increased in steps from a low value, the pressure can be smoothly increased by controlling the degree of opening of the gas inflow rate adjusting valve 40. However, where the pressure in the vicinities of the specimen S is lowered, the pressure may not be smoothly lowered unless the gas staying in the gas supply pipe 42 is vented and then the pressure is adjusted. One example of subroutine for lowering the pressure inside the specimen chamber 2 is described below by referring to the flowchart of FIG. 18, which illustrates operations of the gas controller 812 to lower the pressure inside the specimen chamber 2.

The gas controller 812 determines a pattern of venting steps from the relationship between the present pressure reading of the second vacuum gauge CG2 and the set pressure in the vicinities of the specimen S (step S300). The gas controller 812 determines the operating conditions of the exhaust system for venting the gas supply pipe 42 and other operative conditions including a venting time.

The gas controller 812 closes the gas inflow rate adjusting valve 40, stops the introduction of gas into the specimen chamber 2, and lowers the pressure inside the specimen chamber 2 (step S302).

Then, the gas controller 812 makes a decision as to whether the pressure reading of the second vacuum gauge CG2 has reached a value determined by the pattern of venting steps (step S304). The gas supply pipe 42 will be vented in an operation conducted later. During this interval, the interior of the specimen chamber 2 cannot be vented and so the pressure inside the specimen chamber 2 will rise. To prevent this, the interior of the specimen chamber 2 is once vented.

If the decision at step S304 is NO, indicating that the pressure reading of the second vacuum gauge CG2 has not reached the pressure determined by the pattern of venting steps, the gas controller 812 again makes a decision as to whether the pressure reading of the second vacuum gauge CG2 has reached the value determined by the pattern of venting steps.

If the decision at step S304 is YES, indicating that the pressure reading of the second vacuum gauge CG2 has reached the pressure determined by the pattern of venting steps, the gas controller 812 finds an optimum pressure reading of the first vacuum gauge CG1 from the current pressure reading of the first vacuum gauge CG1 and from the set pressure inside the specimen chamber 2 (step S306). The optimum pressure reading of the first vacuum gauge CG1 is a pressure value at which the pressure can be started to be adjusted efficiently. If the pressure reading of the first vacuum gauge CG1 is lowered to the optimum pressure value, the pressure adjustment can be subsequently made efficiently.

The gas controller 812 determines the interval during which the gas supply pipe 42 is vented from the pattern of venting steps (step S308). The gas controller 812 vents the gas supply pipe 42 with pumping equipment (not shown) for venting the gas supply pipe 42 (step S310).

Then, the gas controller 812 makes a decision as to whether the pressure reading of the first vacuum gauge CG1 has reached the calculated optimum pressure value (step S312).

If the decision at step S312 is NO, indicating that the pressure reading of the first vacuum gauge CG1 has not reached the calculated optimum pressure value, the gas controller 812 goes back to step S310, where the gas supply pipe 42 is vented.

If the decision at step S312 is YES, indicating that the pressure reading of the first vacuum gauge CG1 has reached the calculated optimum pressure value, the gas controller 812 goes to step S314, where a decision is made as to whether the pressures inside the exhaust systems 7a, 7b, and 7c have dropped to a given pressure.

If the decision at step S314 is NO, indicating that the pressures inside the exhaust systems 7a, 7b, and 7c have not dropped to the given pressure, the gas controller 812 goes back to step S314, where a decision is made as to whether the pressures inside the exhaust systems 7a, 7b, and 7c have dropped to the given pressure.

If the decision at step S314 is YES, indicating that the pressures inside the exhaust systems 7a, 7b, and 7c have dropped to the given pressure, the gas controller 812 goes to step S316, where controller switches the operative exhaust system to a different one of the exhaust systems 7a, 7b, and 7c according to the pressure.

The gas controller 812 goes to step S22 of FIG. 14, where the pressure in the vicinities of the specimen S is controlled.

3. Features

The charged particle beam instrument 100 has the following features.

In the charged particle beam instrument 100, the gas controller 812 sets a target value of pressure for the gas supplied into the specimen chamber 2, based on the relational expressions R and d indicating the relationship between the pressure reading of the first vacuum gauge CG1 and the pressure inside the specimen chamber 2 (in the vicinities of the specimen S) and on the corrective coefficient for correcting the pressure reading of the first vacuum gauge CG1 for the species of the gas supplied into the specimen chamber 2, and controls the gas inflow rate adjusting valve 40 such that the pressure reading of the first vacuum gauge CG1 reaches the target value of pressure.

In this way, in the charged particle beam instrument 100, the gas controller 812 sets the target value of pressure for the gas supplied into the specimen chamber 2 from the relational expression R indicating the relationship between the pressure reading of the first vacuum gauge CG1 and the pressure inside the specimen chamber 2 and, therefore, the pressure inside the specimen chamber 2 can be controlled by controlling the gas inflow rate adjusting valve 40. Hence, it is easy to control the pressure inside the specimen chamber 2. Furthermore, in the charged particle beam instrument 100, even if the pressure inside the specimen chamber 2 is not directly measured, the pressure inside the specimen chamber 2 can be controlled.

The gas controller 812 corrects the target value of pressure with a corrective coefficient for correcting the pressure reading of the first vacuum gauge CG1 according to gas species and so the pressure inside the specimen chamber 2 can be controlled for various gas species. Furthermore, when the target value of pressure is found, the relational expression R related to nitrogen gas as shown in FIG. 8 can be applied to various gas species by using corrective coefficients.

In the charged particle beam instrument 100, therefore, the pressure of the gas inside the specimen chamber 2 can be controlled easily. This facilitates performing an in situ observation in a gaseous atmosphere. Furthermore, since the charged particle beam instrument 100 can easily control the pressure of gas in this way, control of the pressure inside the specimen chamber 2 can be automated.

In the charged particle beam instrument 100, the venting portion 7 has the plural exhaust systems 7a, 7b, and 7c which are different in pumping capabilities. The gas controller 812 switches the operative exhaust system between the exhaust systems 7a, 7b, and 7c according to the pressure reading of the second vacuum gauge CG2. Therefore, the range of pressures inside the specimen chamber 2 that can be controlled can be extended from a low pressure (e.g., approximately $5.0 \times 10^{-3}$ Pa) to a high pressure (e.g., approximately $1.0 \times 10^{4}$ Pa). The relational expression R shown in FIG. 8 indicates the relationships between the pressure reading of the first vacuum gauge CG1 and the pressure reading of the second vacuum gauge CG2 in cases where the exhaust systems 7a, 7b, and 7c are used. Therefore, if the operative exhaust system is switched between the exhaust systems 7a, 7b, and 7c, the pressure inside the specimen chamber 2 can be controlled if the gas inflow rate adjusting valve 40 is controlled. Thus, it is easy to control the pressure inside the specimen chamber 2.

In the charged particle beam instrument 100, the exhaust system 7a has the pumping device 70, while the exhaust systems 7b and 7c share the pumping device 72. The pumping devices 70 and 71 are different in pumping capabilities. The exhaust systems 7a, 7b, and 7c have the exhaust pipes 74a, 74b, and 74c, respectively, which are different in diameter. Consequently, the plural exhaust systems 7a, 7b, and 7c different in pumping capabilities are achieved. Thus, the controllable range of pressures inside the specimen chamber 2 can be extended.

The charged particle beam instrument 100 includes the gas inlet nozzle 34 for introducing gas supplied from the gas supply portion 6 into the specimen chamber 2 and the gas inlet nozzle driver 340 for moving the gas inlet nozzle 34. Consequently, the gas inlet nozzle 34 can be moved.

Furthermore, the nozzle driver 340 moves the gas inlet nozzle 34 between the first position P1 close to the specimen holding portion 23 holding the specimen S and the second position P2 more distant from the specimen holding portion 23 than the first position P1. This permits gas to be effectively blown against the specimen S after the gas inlet nozzle 34 has been placed at the first position P1, for example, during an in situ observation (see FIG. 4). During gas purging, the gas inlet nozzle 34 is placed at the second position P2 and the whole interior of the specimen chamber 2 can be replaced by gas without directly blowing gas against the specimen S (see FIG. 5).

In the charged particle beam instrument 100, the gas inlet nozzle 34 has the heater 342 for heating the gas inlet nozzle 34. Consequently, the gas introduced in the specimen chamber 2 can be heated. In addition, the gas inlet nozzle 34 can be baked.

In the charged particle beam instrument 100, the display device 850 includes the display controller 814 that provides control to display the operational information about the gaseous environment adjuster 5. This permits the user to check the operational state of the gaseous environment adjuster 5.

In particular, the display controller 814 provides control such that at least one type of information selected from the group consisting of information about the gas supplied into the specimen chamber 2, information about the species of gas in the pipes 42, 45, 46, 74a, 74b, and 74c through which the gas discharged from the specimen chamber 2 passes, information about the flows of the gases, and the information about the gas remaining in the pipes 42, 45, 46, 74a, 74b, and 74c is displayed on the display device 850. In consequence, the user can obtain information about the gas in the pipes 42, 45, 46, 74a, 74b, and 74c.

Furthermore, the display controller 814 displays information about timewise variation of the pressure reading of the first vacuum gauge CG1 and information about timewise variation of the pressure reading of the second vacuum gauge CG2 on the display device 850. This permits the user to check timewise variations of the pressure readings of the first vacuum gauge CG1 and of the second vacuum gauge CG2.

It is to be understood that the above-described embodiment is merely exemplary and that the invention is not restricted thereto.

In the description of the above-described embodiment, the charged particle beam instrument is a transmission electron microscope. No restriction is imposed on the charged particle beam instrument associated with the present invention as long as it uses a charged particle beam such as of electrons or ions. The charged particle beam instrument associated with the present invention may also be an electron microscope (such as a scanning transmission electron microscope (STEM) or a scanning electron microscope (SEM)), a focusing ion beam (FIB) system, or the like.

In the description of the embodiment described above, a target value of pressure is found using the relational expressions R and d shown in FIG. 8. Such a target value of pressure may be set using only the relational expression R.

The present invention embraces configurations (e.g., configurations identical in function, method, and results or identical in purpose and advantageous effects) which are substantially identical to the configurations described in connection with the above embodiment. Furthermore, the invention embraces configurations which are similar to the configurations described in connection with the above embodiment except that their nonessential portions have been replaced. Additionally, the invention embraces configurations which are identical in advantageous effects to, or which can achieve the same object as, the configurations described in connection with the above embodiment. Further, the invention embraces configurations which are similar to the configurations described in connection with the above embodiment except that a well-known technique is added.

Having thus described our invention with the detail and particularity required by the Patent Laws, what is desired protected by Letters Patent is set forth in the following claims.

The invention claimed is:

1. A charged particle beam instrument for permitting an observation of a specimen in a gaseous atmosphere, said charged particle beam instrument comprising:
   a specimen chamber that accommodates the specimen;
   a gas supply pipe for supplying a gas into the specimen chamber;
   a venting portion for venting the specimen chamber;
   a gaseous environment adjuster including a gas inflow rate adjusting valve for adjusting the flow rate of the gas flowing through the gas supply pipe and a first vacuum gauge for measuring the pressure of the gas supplied into the specimen chamber; and
   a gas controller for controlling the gaseous environment adjuster;
   wherein said gas controller sets a target value of pressure for the gas flowing through the gas supply pipe based on a predetermined relational expression indicating a relationship between the reading of the first vacuum gauge and the pressure inside the specimen chamber and on a corrective coefficient for correcting the reading of the first vacuum gauge according to the species of the gas being supplied into the specimen chamber and controls the gas inflow rate adjusting valve such that the reading of the first vacuum gauge reaches the target value of pressure.

2. The charged particle beam instrument as set forth in claim 1,
wherein said venting portion has a plurality of exhaust systems which are different in pumping capabilities;
wherein said gaseous environment adjuster has a second vacuum gauge for measuring the pressure of the gas discharged from the specimen chamber; and
wherein said gas controller switches an operative exhaust system between the plurality of exhaust systems according to the pressure reading of the second vacuum gauge.

3. The charged particle beam instrument as set forth in claim 2, wherein said plurality of exhaust systems have their respective pumping devices which are different in pumping capabilities.

4. The charged particle beam instrument as set forth in claim 2, wherein said plurality of exhaust systems have their respective exhaust pipes which are different in diameter.

5. The charged particle beam instrument as set forth in claim 1, further comprising:
a gas inlet nozzle permitting the gas supplied from the gas supply portion to be admitted into the specimen chamber; and
a gas inlet nozzle driver for moving the gas inlet nozzle.

6. The charged particle beam instrument as set forth in claim 5, wherein said gas inlet nozzle driver moves said gas inlet nozzle between a first position close to a specimen holding portion operative to hold said specimen and a second position more distant from the specimen holding portion than the first position.

7. The charged particle beam instrument as set forth in claim 5, wherein said gas inlet nozzle has a heater for heating the nozzle.

8. The charged particle beam instrument as set forth in claim 1, further comprising a display device including a display controller that provides control to display operational information about the gaseous environment adjuster.

9. The charged particle beam instrument as set forth in claim 8, wherein said display controller provides control such that at least one type of information selected from the group consisting of information about the gas supplied into said specimen chamber, information about the species of the gas in pipes through which the gas discharged from the specimen chamber passes, information about flows of the gases, and the information about the gas remaining in the pipes is displayed on the display device.

10. The charged particle beam instrument as set forth in claim 8, wherein said display controller provides control to display information about timewise variation of the pressure reading of said first vacuum gauge on said display device.

* * * * *